United States Patent
Tadokoro et al.

(10) Patent No.: US 10,444,267 B2
(45) Date of Patent: Oct. 15, 2019

(54) SIGNAL PROCESSOR

(71) Applicant: KABUSHIKI KAISHA TOYOTA CHUO KENKYUSHO, Nagakute-shi, Aichi-ken (JP)

(72) Inventors: Yukihiro Tadokoro, Nagakute (JP); Hiroya Tanaka, Nagakute (JP)

(73) Assignee: KABUSHIKI KAISHA TOYOTA CHUO KENKYUSHO, Nagakute-shi (JP)

(*) Notice: Subject to any disclaimer, the term of this patent is extended or adjusted under 35 U.S.C. 154(b) by 0 days.

(21) Appl. No.: 15/570,986

(22) PCT Filed: Jul. 12, 2016

(86) PCT No.: PCT/JP2016/003294
§ 371 (c)(1),
(2) Date: Oct. 31, 2017

(87) PCT Pub. No.: WO2017/013851
PCT Pub. Date: Jan. 26, 2017

(65) Prior Publication Data
US 2018/0224487 A1  Aug. 9, 2018

(30) Foreign Application Priority Data

Jul. 17, 2015 (JP) .................. 2015-142854
Oct. 13, 2015 (JP) .................. 2015-202149

(51) Int. Cl.
*G01R 25/00* (2006.01)
*H01P 1/18* (2006.01)
(Continued)

(52) U.S. Cl.
CPC ............... *G01R 25/00* (2013.01); *H01P 1/18* (2013.01); *H03C 1/46* (2013.01); *H03C 3/28* (2013.01);
(Continued)

(58) Field of Classification Search
CPC ...... G01R 23/00; G01R 23/005; G01R 25/00; H03C 1/00; H03C 1/02; H03C 1/46;
(Continued)

(56) References Cited

U.S. PATENT DOCUMENTS 6,803,840 B2 * 10/2004 Hunt .................. B82Y 10/00
205/766
7,157,990 B1   1/2007 Adam et al.
(Continued)

FOREIGN PATENT DOCUMENTS

JP   H09-257900 A   10/1997
JP   2007-027942 A   2/2007

OTHER PUBLICATIONS

Oct. 4, 2016 International Search Report issued in International Patent Application No. PCT/JP2016/003294.
(Continued)

*Primary Examiner* — Hoai-An D. Nguyen
(74) *Attorney, Agent, or Firm* — Oliff PLC

(57) ABSTRACT

To realize a compact device that detects phase or controls phase or an amplitude with high sensitivity, a signal controller includes: a linear conductor having a first end fixed to a negative electrode and a second end serving as a free end; a positive electrode facing the free end with a small gap therebetween; a first signal source that applies a voltage between the negative electrode and the positive electrode, the voltage applied being variable; a driving electrode that applies an electric field to a space around the conductor, the electric field having a component perpendicular to the lengthwise direction of the conductor; and a second signal source that applies an AC signal to the driving electrode. The signal processor can be a device for controlling or modulating phase or amplitude.

20 Claims, 9 Drawing Sheets

(51) Int. Cl.
*H03C 1/46* (2006.01)
*H03C 3/28* (2006.01)
*H03H 9/24* (2006.01)
*H03H 9/66* (2006.01)
*H03C 1/02* (2006.01)
*H03C 3/02* (2006.01)
*G01R 25/04* (2006.01)

(52) U.S. Cl.
CPC ............ *H03H 9/2457* (2013.01); *H03H 9/66* (2013.01); *G01R 25/04* (2013.01); *H03C 1/02* (2013.01); *H03C 3/02* (2013.01)

(58) Field of Classification Search
CPC ... H03C 1/62; H03C 3/00; H03C 3/02; H03C 3/28; H03C 5/00; H03H 9/2457; H03H 9/66; H01P 1/18
USPC ......... 324/76.11, 76.12, 76.13, 76.39, 76.52, 324/76.77, 118, 138, 600, 602, 622, 649, 324/658, 681, 683; 332/103, 144, 145, 332/149; 702/1, 57, 64, 71, 72, 127, 189
See application file for complete search history.

(56) References Cited

U.S. PATENT DOCUMENTS

| | | | |
|---|---|---|---|
| 8,717,046 | B2 | 5/2014 | Jensen et al. |
| 9,377,348 | B2* | 6/2016 | Kataoka .................. G01H 9/00 |
| 9,910,055 | B2* | 3/2018 | Jomori ............... G01C 19/5747 |
| 2011/0057734 | A1* | 3/2011 | White ...................... H03B 5/30 331/56 |

OTHER PUBLICATIONS

Oct. 24, 2017 Office Action issued in Japanese Patent Application No. 2015-142854.
Jensen et al. "Nanotube Radio", Nano Letters, vol. 7, No. 11, pp. 3580-3511, 2007.
Alemán et al. "A Carbon Nanotube-based NEMS Parametric Amplifier for Enhanced Radio Wave Detection and Electronic Signal Amplification", Journal of Physics: Conference Series 302 (2011) 012001.
Purcell et al. "Tuning of Nanotube Mechanical Resonances by Electric Field Pulling", Physical Review Letters, vol. 89, No. 27, 2002.

* cited by examiner

SIGNAL PROCESSOR

TECHNICAL FIELD

The present invention relates to a signal processor that uses a microstructure to electrically control the phase and amplitude of an AC signal or to detect the phase of an electromagnetic wave. The present invention relates, for example, to a phase shifter, to a phase modulator, to an amplitude modulator, and to phase detectors (including wave detectors for phase modulated signals and frequency modulated. signals).

BACKGROUND ART

One known phase shifter used in the microwave band is disclosed in Patent Document 1 below. According to this Patent Document, the output from a VOC is down-converted to a low-frequency signal, and the phase of the output from the VOC is controlled such that the phase difference between the low frequency signal and a phase-controlled reference signal having the same frequency as that of the low frequency signal becomes zero. In this manner, the phase in the microwave range can be controlled using the phase of the low-frequency signal. In the microwave range, the phase of a microwave can be electrically controlled by electrically controlling the capacity or dielectric constant of a strip line.

Meanwhile, Patent Document 2 and Non Patent Document 1 disclose a known high-sensitivity wave detector using a microstructure. In such a wave detector, one end of a carbon nanotube extending straight is fixed to a negative electrode as a fixed end. The other end serves as a free end. The free end faces a planar positive electrode, and a DC bias voltage is applied between the positive electrode and the negative electrode. In this device, a tunneling current due to field emission of electrons flows from the free end of the carbon nanotube toward the positive electrode, and the magnitude of the current varies according to the distance between the free end of the carbon nanotube and the positive electrode. The cantilevered carbon nanotube with one end fixed has a mechanical natural resonance frequency. When the frequency of an incoming wave coincides with the resonance frequency, the carbon nanotube vibrates significantly in an arc about the fixed end. If the resonance frequency can be changed, the device can be tuned to a specific radio wave.

The tip of the carbon nanotube is charged with electric charges as a result of application of the DC bias voltage. Under the assumption that the carbon nanotube extends from its fixed end along a straight line (serving as a center axis), the electric charges at the tip receive forces due to the electric field of an incoming wave. These forces are proportional to the magnitude of a component of the electric field of the incoming wave which component is normal to the center axis of the carbon nanotube (this component is hereinafter referred to as a "normal component"). When an incoming wave is present, the carbon nanotube in a tuned state vibrates significantly about the center axis with the same amplitude on both sides. This vibration causes the distance between the free end of the carbon nanotube and the positive electrode to vibrate at a frequency twice the frequency of the incoming radio wave, and the amplitude of this vibration is proportional to the normal component of the electric field of the incoming wave. In this case, the tunneling current also vibrates at a frequency twice the frequency of the incoming wave, and the amplitude of this vibration is proportional to the normal component of the electric field of the incoming wave. In the device proposed in Patent Document 2 and Non-Patent Document 1, the above-described principle is used to detect a radio wave using only the carbon nanotube, the negative electrode, the positive electrode, and the DC bias power source.

Non-Patent Document 2 discloses a device having the structure described in Non-Patent Document 1 and further including an electrode parallel to the carbon nanotube. This electrode is applied with an AC voltage which, is DC-biased with a voltage $V_0$, has a frequency twice the frequency of the incoming wave, and has an amplitude $V_p$. In this device, the amplitude of the vibration of the carbon nanotube can be changed by adjusting the DC bias voltage $V_0$ and the value of the amplitude Vp, i.e., gain can be controlled.

PRIOR ART DOCUMENTS

Patent Documents

Patent Document 1: Japanese Patent Application Laid-Open (kokai) No. 2007-27942
Patent Document 2: U.S. Pat. No. 8,717,046B2

Non-Patent Documents

Non-Patent Document 1: K. Jensen, C. Weldon, H. Garcia, and A. Zettl, "NanoLube Radio," Nano Letters, vol. 7, no. 11, pp. 3508-3511, November 2007.
Non-Patent Document 2: B J Aleman, A Sussman, N Mickelson and A Zettl, "A Carbon Nanotube-based NEMS Parametric Amplifier for Enhanced Radio Wave Detection and Electronic Signal Amplification" Journal of Physics: Conference Series 302 (2011) 012001

SUMMARY OF THE INVENTION

Problems to be Solved by the Invention

Examples of conventional phase shifters include a device in which its output signal is down-converted and a VOC is oscillated such that the phase difference between the down-converted signal and a control signal having the same frequency in a low-frequency range becomes zero; and a device that uses a microstrip line. However, it is difficult to reduce their sizes. To detect the phase of an electromagnetic wave, various types of electronic circuits are used. For example, by using synchronous detection and quadrature demodulation with a PLL, phase information can be obtained accurately.

An object of the present invention is to realize a signal processor which is compact and is high in signal processing sensitivity using a new principle without using the above electronic circuits. Examples of the signal processor include a phase shifter, a phase modulator, an amplitude modulator, and a phase detector for electromagnetic waves.

Means for Solving the Problems

A first aspect of the present invention which solves the above-described problem is a signal processor for processing an AC signal, comprising: a support conductor; a linear conductor having a first end fixed to the support conductor, the linear conductor vibrating in response to an AC electric field so as to have a displacement component perpendicular to a lengthwise direction of the linear conductor; a control electrode that applies the AC electric field to the linear conductor, the AC electric field having a component perpendicular to the lengthwise direction of the linear conductor; a detection electrode that detects vibration signal generated as a result of the vibration of the linear conductor; a signal source that applies an AC signal to the control electrode; and an output unit that uses, as a processed signal obtained from the AC signal, information about the amplitude of the vibration signal detected by the detection electrode or the phase of the vibration signal.

In the present invention, the support conductor can have any shape, so long as a voltage can be applied to the linear conductor. The linear conductor used is an electrically conductive member that is bendable and vibratable in response to an electromagnetic wave and may be a carbon nanotube, a metal wire, or conductive silicon. The linear conductor may be a cantilever whose one end is fixed to the support conductor and whose other end is a vibratable free end or a both end supported beam having opposite ends fixed to two opposed support conductors such that the central portion of the beam can vibrate. Examples of the processed signal obtained from the AC signal include a signal obtained by shifting the phase of the AC signal, a signal obtained by subjecting the AC signal to phase modulation, a signal obtained by subjecting the AC signal to amplitude modulation, and a detection signal of the phase of the electromagnetic wave which signal is to be combined with the AC signal.

According to a second aspect of the invention, in the signal processor according to the first aspect, the support conductor comprises a negative electrode and a positive electrode; the first end of the linear conductor is fixed to the negative electrode, the linear conductor having a second end serving as a free end, the second end being disposed so as to face the positive electrode with a small gap between the second end and the positive electrode; the signal processor further comprises a tension control signal source that applies a variable voltage between the negative electrode and the positive electrode, the variable voltage being used to control a tension applied to the linear conductor; and the output unit outputs a signal that is obtained by controlling the amplitude or phase of the AC signal outputted from the signal source according to the variable voltage outputted from the tension control signal source.

In the second aspect, the negative electrode and the positive electrode are generally flat plates but may be spheres or may be curved bodies. The surface of the positive electrode that faces the free end of the linear conductor may be any surface such as a flat surface or a curved surface so long as the distance between the surface and the free end changes in response to the vibration of the linear conductor. Similarly, the control electrode may be a flat plate, a sphere, or a curved body. The positive electrode may have a structure in which its portion facing the free end of the linear conductor protrudes toward the free end from the remaining portion. The linear conductor used may be any linear conductor so long as its free end can vibrate toward opposite sides with respect to the center axis of the linear conductor. The linear conductor used may be a carbon nanotube or a nanowire composed of a metal or a conductive semiconductor such as conductive silicon.

In the second aspect, the AC signal outputted from the signal source is applied to the control electrode, and the AC electric field can thereby be generated in a space around the free end of the linear conductor. The AC electric field causes the free end to vibrate about the center axis of the linear conductor toward opposite sides thereof. The vibration causes the distance between the positive electrode and the free end to change periodically, so that the number of electrons (tunneling current) field-emitted from the free end of the linear conductor toward the positive electrode oscillates in response to the AC signal outputted from the signal source. The voltage outputted from the tension control signal source is applied to the free and the positive electrode, and the free end is attracted toward the positive electrode. The attractive force can be changed according to the variable voltage outputted from the tension control signal source. The larger the attractive force, the larger the elastic constant of the linear conductor. Therefore, by changing the variable voltage outputted from the tension control signal source, the elastic constant can be changed. By changing in the elastic constant, the phase and amplitude of the tunneling current can be controlled. This is the inventive principle of the second aspect of the present invention.

The AC signal outputted from the signal source desirably has a frequency that is set to be equal to the natural frequency of the vibration of the free end of the linear conductor. In this case, the gain of the phase- or amplitude-modulated signal flowing through the positive electrode or the negative electrode can be maximized.

The signal processor may be a phase shifter, and the output unit may be an output unit which outputs a signal that is obtained by shifting the phase of the AC signal outputted from the signal source by a phase shift amount determined by a DC voltage outputted from the tension control signal, source. The desired signal with its phase controlled can be branched and outputted from a line connected to the positive electrode or the negative electrode.

The signal processor may be a phase modulator, and the output unit may be an output unit which outputs a signal that is obtained by modulating the phase of the AC signal outputted from the signal source according to a biased AC signal which is outputted from the tension control signal source as a variable voltage.

The signal processor may be an amplitude modulator, and the output unit may be an output unit which outputs a signal that is obtained by modulating the amplitude of the AC signal outputted from the signal source according to a biased AC signal which is outputted from the tension control signal source as a variable voltage.

According to a third aspect, in the signal processor according to the first aspect, the signal processor is a phase detector that detects the phase of an incoming electromagnetic wave; the linear conductor is a conductor that vibrates in response to an electric field of the electromagnetic wave so as to have a displacement component perpendicular to the lengthwise direction of the linear conductor; and the output unit includes a phase detector that detects the phase of the electromagnetic wave from the amplitude of the vibration signal detected by the detection electrode.

In the third aspect as well, as in the first aspect, the linear conductor may be a cantilever whose one end is fixed to the support conductor and whose other end is a vibratable free end and may be a both end supported beam having opposite ends fixed to two opposed support conductors such that the central portion of the beam can vibrate.

When the linear conductor is a cantilever, the following structure may be used.

According to a fourth aspect, in the signal processor according to the third aspect, the support conductor comprises a negative electrode and a positive electrode; the first end of the linear conductor is fixed to the negative electrode, the linear conductor having a second end serving as a free end, the second end being disposed so as to lace he positive electrode with a small gap between the second end and the positive electrode; and the signal processor further comprises a tension control signal source that applies a variable voltage between the negative electrode and the positive electrode, the variable voltage being used to control a tension applied to the linear conductor.

In this structure, electrons are field-emitted from the free end of the linear conductor toward the positive electrode serving as the detection electrode, and a tunneling current thereby flows. The fact that the magnitude of the tunneling current depends on the displacement of the free end is used. With this device, the phase of the electromagnetic wave is detected from the difference in phase between the electromagnetic wave and the AC signal.

In this structure, the tension control signal source may be a variable voltage DC power source. Electrons are accumulated in the linear conductor, and the free end receives a Coulomb force directed toward the positive electrode. The elastic constant of the linear conductor depends on the Coulomb force, and the Coulomb force can be changed by the above voltage. Therefore, by changing the voltage of the tension control signal source, the elastic constant of the linear conductor is changed, and the resonance frequency of the linear conductor can thereby be changed. In other words, the frequency of the electromagnetic wave to which the linear conductor is sensitive can be selected. Accordingly, in the present invention, the variable voltage outputted from the tension control signal source is desirably controlled such that the resonance frequency of the linear conductor is equal to the frequency of the electromagnetic wave. By bringing the linear conductor into a resonant state, the receiving sensitivity can be increased. The phase detector may be configured to detect the phase of the electromagnetic wave from the amplitude of the baseband signal of the vibration signal, the amplitude of the fundamental frequency component, or the amplitude of the second harmonic component.

When the linear conductor is a both end supported beam, the following structure may be used.

According to a fifth aspect of the present invention, in the signal processor according to the third aspect, the support conductor comprises a first support conductor and a second support conductor, the first end of the linear conductor being fixed to the first support conductor, the linear conductor having a second end fixed to the second support conductor.

In this structure, the linear conductor vibrates in response to the electromagnetic wave such that the amplitude becomes maximum at the midpoint of the linear conductor in the lengthwise direction. The detection electrode detects the displacement of this portion due to vibration. For example, the detection electrode may be configured to detect the capacitance between the detection electrode and the linear conductor to thereby detect the vibration signal. The detection electrode may be parallel to the linear conductor and may be disposed at a position opposite the control electrode with respect to the linear conductor. The control electrode may serve also as the detection electrode. When the frequency of the AC signal applied to the control electrode differs from the frequency of the vibration signal detected by the detection electrode, the vibration signal can be separated and extracted even when the control electrode is the same as the detection electrode.

In the signal processor according to any of the third through fifth aspects, the AC signal outputted from the signal source may be an AC voltage biased by an arbitrary DC voltage. It is desired that the DC voltage be controlled such that the resonance frequency of the linear conductor equal to the frequency of the electromagnetic wave. The control electrode to which the AC signal is applied generates an electric field having a component perpendicular to the lengthwise direction of the linear conductor. In the presence of this electric field, the linear conductor receives a Coulomb force. The DC voltage included in the biased AC signal causes a constant Coulomb force to act on the linear conductor. By changing the DC voltage, the elastic constant of the linear conductor can be changed. Desirably, the frequency of the AC signal is set to be equal to the resonance frequency of the linear conductor. Specifically, in terms of increasing the detection sensitivity, it is preferable that the frequency of the electromagnetic wave received, the frequency of the AC signal, and the resonance frequency of the linear conductor are equal to each other. In terms of improving the precision of phase detection, it is necessary that the frequency of the electromagnetic wave be equal to the frequency of the AC signal. The phase detector may detects the phase of the electromagnetic wave from the amplitude of a second harmonic of the vibration signal.

In the signal processor according to any of the first through fifth aspects, a grounding electrode may be disposed at a position opposite a position of the control electrode with respect to the linear conductor. Since the electric field generated between the control electrode and the grounding electrode is linear, the electric field can be applied to the linear conductor so as to be perpendicular to the center axis of the linear conductor. This allows the vibration of the free end to be generated efficiently. When the control electrode and the grounding electrode are disposed such that their facing surfaces are parallel to each other, a capacitor composed of parallel flat plates or parallel curved plates is formed. In this case, a straight electric field can be applied to the linear conductor, and the vibration can be generated efficiently.

A plurality of conductors may be disposed parallel to each other. In this case, the amplitude of the desired output signal can be increased.

A sixth aspect or the present invention is a phase detector comprising:

an electromagnetic waive detection unit which includes at least the support conductor, the linear conductor, and the detection electrode recited in any one of the third through fifth aspect of the present invention and which receives the electromagnetic wave by the linear conductor and outputs, from the detection electrode, a vibration signal based on the electromagnetic wave as an electromagnetic wave detection signal which is a voltage signal;

a reference signal output unit which includes at least the support conductor, the linear conductor, the control electrode, the detection electrode, and the signal source recited in any one of the third through fifth aspect of the present invention, in which the frequency of the AC signal from the signal source is set to be equal to the frequency of the electromagnetic wave, which is shielded so as to block the electromagnetic wave, and which outputs, from the detection electrode, a vibration signal based on the AC signal as a voltage reference signal; and a phase detection unit including at least the support conductor, the linear conductor, the control electrode, the detection electrode, and the phase detector recited in any one of the third through fifth aspect of the present invention and which further includes an additional control electrode disposed at a position opposite a position of the control electrode of the phase detection unit with respect to the linear conductor of the phase detection unit so as to be parallel to the control electrode of the phase detection unit, wherein the electromagnetic wave detection signal outputted from the electromagnetic wave detection unit is applied to the control electrode of the phase detection unit, and the reference signal outputted from the reference signal output unit is applied to the additional control electrode.

In this structure, the vibration signal generated only from the electromagnetic wave is outputted, as the electromagnetic wave detection signal, from the electromagnetic wave detection unit, and the vibration signal generated from the AC signal is outputted, as the reference signal, from the reference signal output unit. The electromagnetic wave detection signal is applied to the control electrode of the phase detection unit, and the reference signal is applied to the additional control electrode. The control electrode, the additional control electrode, and the linear conductor are parallel to each other. Therefore, the direction of the electric field generated by the control electrode and the direction of the electric field generated by the additional control electrode are parallel to each other and perpendicular to the lengthwise direction of the linear conductor. The amplitude of the composite electric field generated by these electrodes varies according to the difference in phase between the electromagnetic wave detection signal and the reference signal, so that the amplitude of the vibration of the linear conductor can be changed according to the phase difference. As a result, the sensitivity of detection of the phase of the electromagnetic wave can be improved.

Effects of the Invention

In the first aspect of the present inventions the new principle is utilized, and a compact signal processor which is high in signal processing sensitivity, such as a phase shifter, a phase modulator, an amplitude modulator, a phase detector for electromagnetic waves, etc., can be realized.

In the second aspect, the field emission tunneling current flowing between the free end of the linear conductor and the positive electrode is processed to obtain the desired signal. Therefore, the present device has a simple structure and can be reduced in size, and its control sensitivity can be increased.

In the third to sixth aspects, the composite electric field composed of the electric field of the electromagnetic wave and the electric field generated by the control electrode is applied to the linear conductor, and the phase of the electromagnetic wave is detected from the vibration signal generated in response to the vibration of the linear conductor. The vibration signal is non-linear with respect to the composite electric field. Therefore, the difference in phase between the electromagnetic wave and the AC signal can be detected with high sensitivity. Since the resonance frequency of the linear conductor is relatively low, the present device, which is an ultracompact device of submicron scale, can detect the phase of a relatively low frequency wave such as a radio wave without using a large antenna.

MODES FOR CARRYING CUT THE INVENTION

The present invention will next be described by way of specific embodiments. However, the present invention is not limited to the following embodiments.

Embodiment 1

Figure 1:
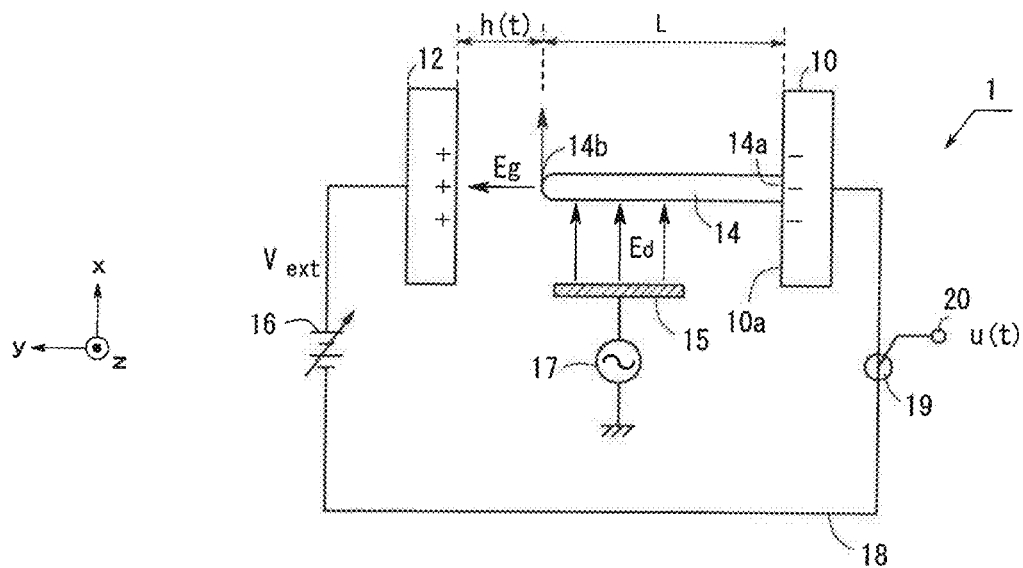
FIG. 1 Configuration diagram showing a signal processor according to specific embodiment 1 of the present invention.

The present embodiment is an example in which the signal processor of the present invention is used for a device capable of signal control such as phase shifting, phase modulation, or amplitude modulation. FIG. 1 is a configuration diagram showing a phase shifter 1. One end of a carbon nanotube (hereinafter denoted as "CNT") 14 extending linearly in a y-axis direction is a fixed end 14a fixed to one surface 10a of a flat plate-shaped negative electrode 10. The other end of the CNT 14 is a free end 14b. A flat plate-shaped positive electrode 12 is disposed so as to face the free end 14b. The negative electrode 10 corresponds to the support conductor, and the positive electrode 12 corresponds to the detection electrode.

A first signal source 16 that is a tension control signal source for applying a voltage between the negative electrode 10 and the positive electrode 12 is connected to the negative electrode 10 and the positive electrode 12. A driving electrode 15 that is a flat plate-shaped control electrode is disposed parallel to the center axis of the CNT 14 (the y axis). A second signal source 17 that is a signal source for outputting an AC signal is connected to the driving electrode 15. The driving electrode 15 generates a driving electric field $E_d$ according to the output of the second signal source 17. The driving electric field $E_d$ is an AC electric field in a direction (x axis direction) perpendicular to the center axis of the CNT 14. In the presence of the driving electric field $E_d$, charges accumulated near the free end of the CNT 14 receive Coulomb forces, and the CNT 14 vibrates about the center axis (y axis) of the CNT 14 in a direction (x axis direction) perpendicular to the center axis. A branching unit 19 is inserted in a line 18 connecting the negative electrode 10 to the positive electrode 12, and a desired signal with its phase controlled is outputted from a branch terminal 20 of the branching unit 19. When the signal outputted from the second signal source 17 is a carrier wave and the signal outputted from the first signal source 16 is a modulating signal, a signal obtained by modulating the carrier wave with the modulating signal flows through the line 18, and the desired modulated signal is outputted from the output terminal 20 of the branching unit 19. An output unit is composed of the line 18 and the branching unit 19.

Next, the operation of the phase shifter 1 according to the present embodiment will be described. The output signal $V_{ext}$ of the first signal source 16 is assumed to be a variable DC voltage for the sake of simplifying the description. The AC signal outputted from the second signal source 17 is assumed to be a single sinusoidal wave for the sake of simplifying the description.

1. Field Emission (Tunneling Conduction)

Let the gap between the forward free end 14b of the CNT 14 and the positive electrode 12 facing the free end 14b (the gap is hereinafter referred to as a "free end distance") be h(t). The free end distance h(t) is a function of time. This is because the free end 14b of the CNT 14 vibrates in the z axis direction as described later and therefore the free end distance changes with time.

As is well known, when field emission of electrons from the free end 14b toward the positive electrode 12 occurs, the current I(t) flowing through the line 13 is represented by equation (1).

[Formula 1]

$$I(t) = c_1 A (E_g(h))^2 \exp\left(-\frac{c_2}{E_g(h)}\right) \quad (1)$$

Here, A is the area of a cross section of the free end 14b of the CNT 14 which cross section is perpendicular to the center axis, and $c_1$ and $c_2$ are coefficients determined by fundamental constants and the work function of the CNT 14. Specifically, $c_1 = 3.4 \times 10^{-5}$ A/V$^2$, and $c_2 = 7.0 \times 10^{10}$ V/m. $E_g(h)$ is the electric field in the vicinity of the surface of the free end 14b (hereinafter referred to as a "free end surface electric field") and is generated by the voltage $V_{ext}$ the output signal of the first signal source 16. The free end surface electric field $E_g(h)$ is a function of the free end distance h(t).

h(t) the distance between the free end 14b and the positive electrode 12 when the CNT 14 bends to vibrate acid the free end 14b vibrates in the x axis direction with the lapse of time t. The linear approximation of h(t) is given by equation (2).

[Formula 2]

$$h(t) = h_0 + \Delta h(t) \quad (2)$$

Here, $h_0$ is the distance between the free end 14b and the positive electrode 12 when the CNT 14 is not bent and is straight and parallel to the y axis, i.e., is the minimum value of the free end distance. $\Delta h(t)$ is an increase in the free end distance with respect to the free end distance $h_0$ when the free end 14b bends and vibrates in the x axis direction with the lapse of time t. Note that $\Delta h(t) > 0$.

The free end surface electric field $E_g(h)$ is a function of the free end distance h, and the linear approximation of the free end surface electric field $E_g(h)$ is given by equation (3). $E_{g0}$ is the free end surface electric field when the CNT 14 is not bent and is straight and parallel to the y axis. When the free end 14b vibrates in the x axis direction as a result of bending of the CNT 14 and the free end distance h(t) increases by $\Delta h(t)$, an increase in the free end surface electric field $\Delta E_g(h)$ with respect to $E_{g0}$ is represented by equation (4). As the free end distance h(t) increases, the free end surface electric field $E_g(h)$ decreases. Therefore, although. $\Delta h(t) > 0$, $\Delta E_g(h) < 0$.

[Formula 3]

$$E_g(h_0 + \Delta h(t)) = E_{g0} + \left(\frac{\partial E_g}{\partial h}\right)_{h=h_0} \Delta h(t) \quad (3)$$

[Formula 4]

$$\Delta E_g(h) = \left(\frac{\partial E_g}{\partial h}\right)_{h=h_0} \Delta h(t) \quad (4)$$

The linear approximation of the tunneling current I(t) is defined by equation (5) using a tunneling current $I_0$ and an increase in the tunneling current $\Delta I(t)$. $I_0$ is a tunneling current when the CNT 14 is not bent and is straight and parallel to the y axis, i.e., the maximum value of the tunneling current I(t). $\Delta I(t)$ is an increase in the tunneling current when the CNT is bent to cause the free end 14b to vibrate in the x axis direction and the free end distance h(t) increases by $\Delta h(t)$. Note that $\Delta I(t) < 0$.

The current $I_0$ is a current when the free end surface electric field is $E_{g0}$ and is represented by equation (6) using equation (1). The increase $\Delta I(t)$ is obtained through expansion of equation (1) to the first order with respect to the free end surface electric field $E_g$; i.e., given by equation (7).

[Formula 5]

$$I(t) = I_0 + \Delta I(t) \quad (5)$$

[Formula 6]

$$I_0 = c_1 A (E_{g0})^2 \exp\left(-\frac{c_2}{E_{g0}}\right) \quad (6)$$

[Formula 7]

$$\Delta I(t) = I_0 \left(2 + \frac{c_2}{E_{g0}}\right)\left(\frac{\Delta E_g(t)}{E_{g0}}\right) \quad (7)$$

By substituting the relation between the increase $\Delta E_g(h)$ and the increase $\Delta h(t)$ represented by equation (4) into equation (7), the increase $\Delta I(t)$ in the tunneling current $I(t)$ is represented by equation (8).

[Formula 8]
$$\Delta I(t) = I_0 \left(2 + \frac{c_2}{E_{g0}}\right) \left(\frac{\partial E_g}{\partial h}\right)_{h=h_0} \frac{\Delta h(t)}{E_{g0}} \quad (8)$$

2. Vibration of CNT 14

The driving electrode 15 generates the AC driving electric field in the direction perpendicular to the center axis (in the x axis direction) according to the output of the second signal source 17, and the AC driving electric field at the position of the center axis of the CNT 14 is denoted by $E_d(t)$. $E_d(t)$ is represented by equation (9). D is the amplitude of the driving electric field $E_d(t)$.

[Formula 9]
$$E_d(t) = D \cos(\omega t) \quad (9)$$

The CNT 14 is a cantilever having the fixed end 14a and the free end 14b. Therefore, in the presence of the AC driving electric field $E_d$, negative charges Q accumulated in the vicinity of the free end 14b of the CNT 14 receive Coulomb forces. The CNT 14 thereby bends in the x axis direction perpendicular to the center axis, and the free end 14b of the CNT 14 vibrates in the x axis direction in response to changes in the polarity of the driving electric field $E_d$. The equation of motion of the vibrating free end 14b in the x coordinate is given by equation (10).

[Formula 10]
$$m\frac{d^2x}{dt^2} + s\frac{dx}{dt} + kx = QD \cos(\omega t) \quad (10)$$

Here, m is the effective mass of the CNT 14, s is a damping coefficient, k is an elastic constant, and Q is the amount of charges accumulated in the free end 14b of the CNT 14. The elastic constant k is given by equation (11).

[Formula 11]
$$k = \frac{3YP}{L^3} \quad (11)$$

Here, Y is Young's modulus, P is the moment of inertia of the CNT 14, and L is the length of the CNT 14.

A solution of the differential equation (10), i.e., the x coordinate $x(t)$ of the free end 14b, is represented by equation (12).

[Formula 12]
$$x(t) = B \cos(\omega t - \phi) \quad (12)$$

The amplitude B is represented by equation (13), and the phase $\phi$ is represented by equation (14).

[Formula 13]
$$B = \frac{QD}{\sqrt{(k - m\omega^2)^2 + (s\omega)^2}} \quad (13)$$

[Formula 14]
$$\phi = \tan^{-1}\left(\frac{s\omega}{k - m\omega^2}\right) \quad (14)$$

The vibration of the free end 14b of the CNT 14 has a resonance angular frequency (hereinafter referred to simply as a "resonance frequency") $\omega_0$ represented by equation (15). When the angular frequency (hereinafter referred to simply as "frequency") of the driving electric field $E_d$ is equal to the resonance frequency $\omega_0$, the x coordinate $x_{reso}(t)$ of the free end 14b is represented by equation (16).

[Formula 15]
$$\omega_0 = \sqrt{\frac{k}{m}} \quad (15)$$

[Formula 16]
$$x_{reso}(t) = \frac{QD}{s\omega_0} \cos(\omega_0 t - \phi) \quad (16)$$

3. Phase Control

Figure 2:
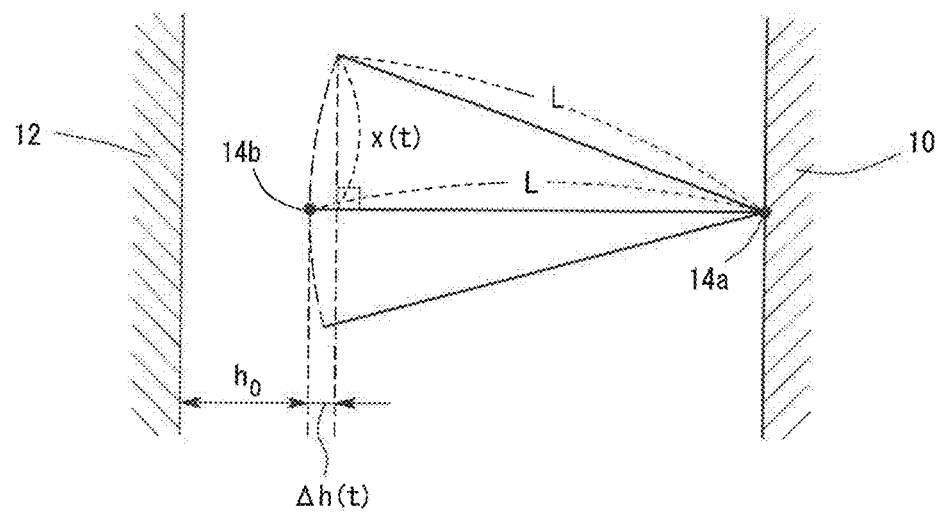
FIG. 2 Illustration showing the relation among an increase Δh in distance between a tip of a carbon nanotube and a positive electrode, the x coordinate of the tip, and the length L of the carbon nanotube in the embodiment.

As is clear from equation (8), the increase $\Delta I(t)$ in the tunneling current $I(t)$ depends on the increase $\Delta h(t)$. Under the assumption that the CNT 14 is a rigid body, the vibration of the free end 14b is approximated as infinitesimal rotational vibration about the fixed end 14a in positive and negative directions. As shown in FIG. 2, $\Delta h(t)$ is represented by equation (17) that is derived from the Pythagorean theorem using the position $x(t)$ of the free end 14b and the length L of the CNT 14.

[Formula 17]
$$\Delta h(t) = L - \sqrt{L^2 - x^2(t)} \quad (17)$$

An approximation of equation (17) is given by equation (18)

[Formula 18]
$$\Delta h(t) = L\left\{1 - \sqrt{1 - \left(\frac{x(t)}{L}\right)^2}\right\} \quad (18)$$
$$= \frac{x^2(t)}{2L}$$

By substituting equation (18) into equation (8) representing $\Delta I(t)$, $\Delta I(t)$ is represented by equation (19). By using a constant G defined by equation (21), $\Delta I(t)$ proportional to the square of the x coordinate of the free end 14b as shown by equation (20). As the free end distance $h(t)$ increases, the free end surface electric field $E_g$ decreases. Therefore, $\partial E_g/\partial h$ is defined as negative, and the constant G is defined as positive.

[Formula 19]
$$\Delta I(t) = I_0\left(2 + \frac{c_2}{E_{g0}}\right)\left(\frac{\partial E_g}{\partial h}\right)_{h=h_0} \frac{x^2(t)}{2LE_{g0}} \quad (19)$$

[Formula 20]
$$\Delta I(t) = -I_0 G\, x^2(t) \quad (20)$$

[Formula 21]
$$G = -\left(2 + \frac{c_2}{E_{g0}}\right)\left(\frac{\partial E_g}{\partial h}\right)_{h=h_0} \frac{1}{2LE_{g0}} \quad (21)$$

By substituting x(t) represented by equation (12) into equation (20), equation (22) as obtained.

[Formula 22]

$$\Delta I(t) = -\tfrac{1}{2} I_0 G B^2 \{\cos[2(\omega t - \phi)] + 1\} \quad (22)$$

When the frequency of the driving electric field $E_d$ is equal to the resonance frequency $\omega_0$, the CNT 14 is in a resonant state. In this case, by substituting equation (16) representing the x coordinate of the free end 14b in the resonant state into equation (20), equation (23) is obtained.

[Formula 23]

$$\Delta I(t) = -\tfrac{1}{2} I_0 G \left(\frac{QD}{s\omega_0}\right)^2 \{\cos[2(\omega_0 t - \phi)] + 1\} \quad (23)$$

As shown above, whereas the driving signal is a signal of $\cos(\omega t)$, the increase $\Delta I(t)$ in the tunneling current is represented by a DC component and an AC component $\cos\{2(\omega t - \phi)\}$.

Figure 3:
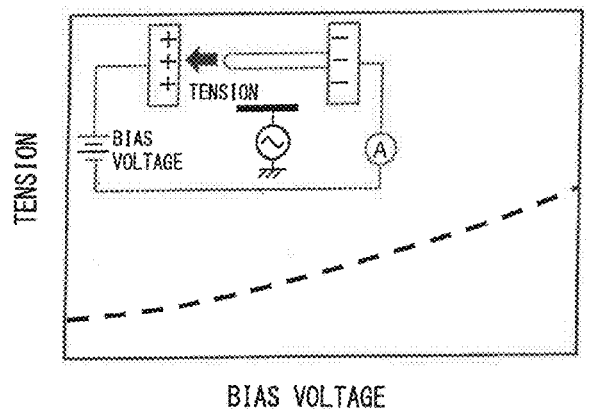
FIG. 3 Characteristic diagram showing the relation between the voltage outputted from a first signal source in the device in the embodiment and the tension of the carbon nanotube.
Figure 4:
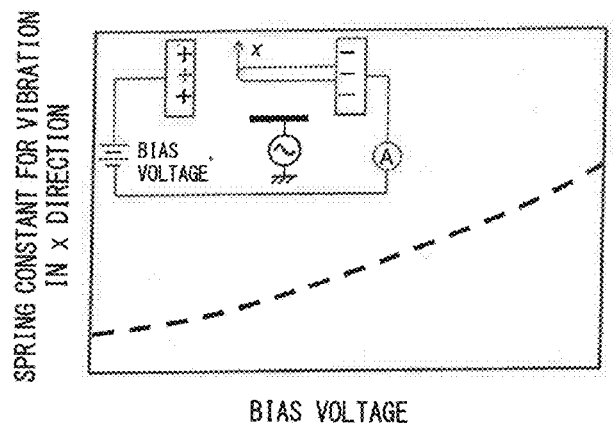
FIG. 4 Characteristic diagram showing the relation between the voltage outputted from the first signal source in the device in the embodiment and an elastic constant of the carbon nanotube that is relevant to the vibration mode of the free end of the carbon nanotube.
Figure 5:
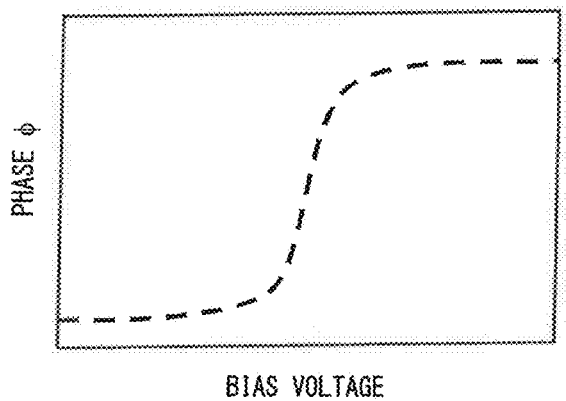
FIG. 5 Characteristic diagram showing the relation between the voltage outputted from the first sigma source in the device in the embodiment and the phase of a target signal that flows through the positive electrode or a negative electrode.

As shown in equation (14), the phase $\phi$ of this signal can be changed by changing the elastic constant k of the CNT 14. The elastic constant k depends on the voltage $V_{ext}$ of the first signal source 16. As shown in FIG. 3, as the voltage $V_{ext}$ (bias voltage) increases, be attractive force acting on the free end 14b of the CNT 14 from the positive electrode 12 increases. Specifically, a tensile stress (tension) in the y-axis direction, i.e., the center axis direction, is applied to the CNT 14. As shown in FIG. 4, the larger the tensile stress in the center axis direction, the larger the elastic constant k of the free end 14b in the x axis direction perpendicular to the center axis. Specifically the elastic constant k is $k=g(V_{ext})$ which is a function of the voltage V of the first signal source 16.

As is clear from equation (14), when the voltage $V_{ext}$ is controlled such that k is close to $m\omega^2$, the phase $\phi$ can be changed largely by changing k slightly. As is clear from equation (13), the amplitude B of the vibration of the free end 14b in the x axis direction can also be changed largely by changing k slightly.

As described above, by controlling the voltage $V_{ext}$ of the first signal source 16, the amplitude and phase of a signal u(t) obtained from the branch terminal 20 of the branching unit 19 can be changed (shifted) from the phase of the output signal of the second signal source 17.

When the output voltage $V_{ext}$ of the first signal source 16 is a DC voltage, the amplitude and phase of the signal u(t) are controlled. The phase and the amplitude can be changed by changing the voltage $V_{ext}$.

When the output signal of the second signal source 17 is used as a carrier wave and the output of the first signal source 16 is an AC signal v(t) with its center at a bias level $V_0$, the carrier wave can be modulated to realize phase modulation or amplitude modulation with the AC signal v(t) used as a modulating signal.

Embodiment 2

Figure 6:
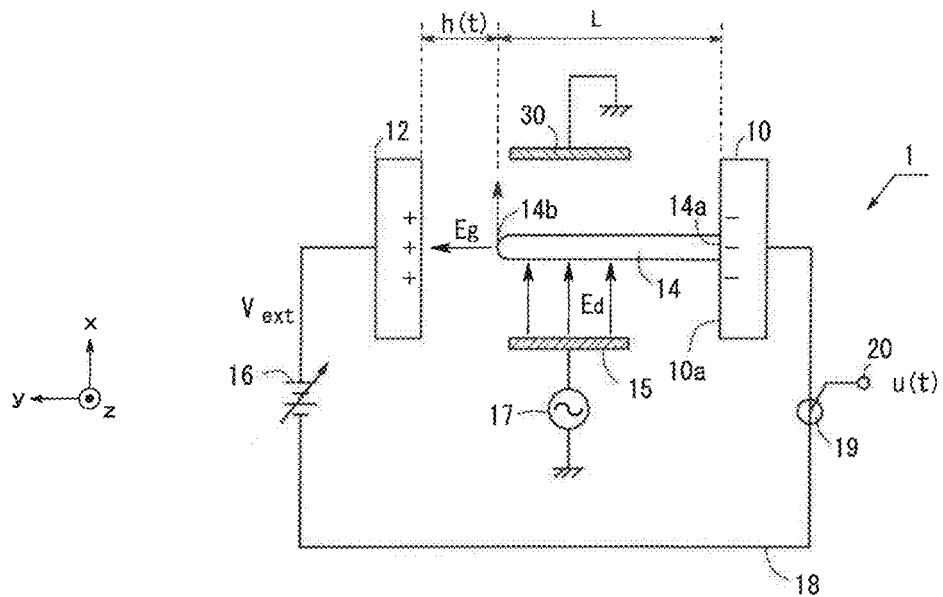
FIG. 6 Configuration diagram showing a signal processor according to another specific embodiment 2 of the present invention.

FIG. 6 shows a signal processor according to embodiment 2. The difference from the device of embodiment 1 is that a grounding electrode 30 is disposed at a position symmetric to the position of the driving electrode 15 used as the control electrode with respect to the CNT 14 serving as a center axis. With this configuration, the driving electric field $E_d$ that is an AC electric field generated by the driving electrode 15 can be exactly parallel to the x axis, i.e., exactly perpendicular to the center axis of the CNT 14. This allows the free end 14b of the CNT 14 to vibrate efficiently in the x axis direction. The other components are the same as those in embodiment 1.

Embodiment 3

Figure 7:
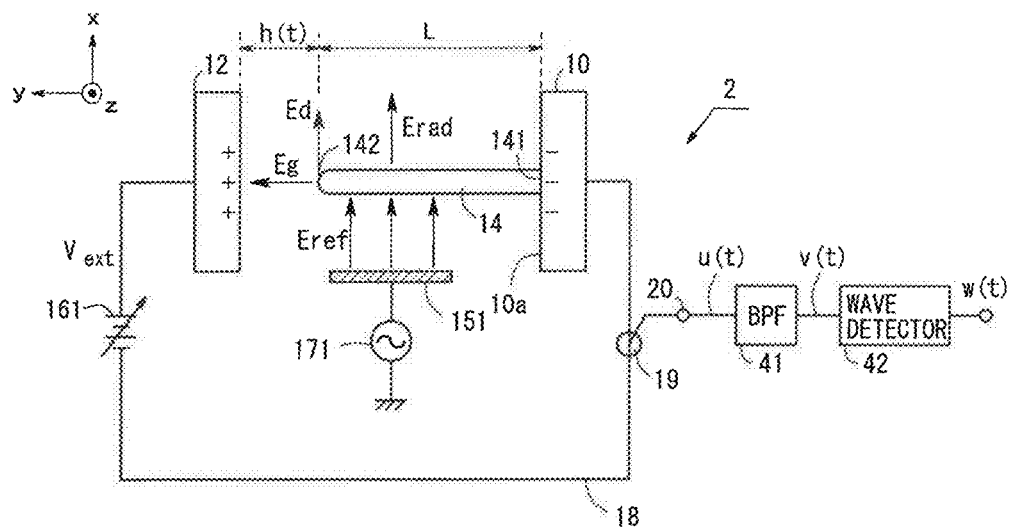
FIG. 7 Configuration diagram showing a signal processor according to another specific embodiment 3 of the present invention.

The present embodiment is an example in which the signal processor of the present invention is used for a phase detector that detects the phase of a signal. A scope of the phase detector includes a demodulator for a phase modulated signal or a frequency modulated signal. FIG. 7 is a configuration diagram showing the phase detector 2. Components having the same functions as those of components in embodiment 1 are denoted by the same numerals. One end of the CNT 14 extending linearly in the y-axis direction a fixed no 141 fixed to one surface 10a of the flat plate-shaped negative electrode 10. The other end of the CNT 14 is a free end 142. The flat plate-shaped positive electrode 12 is disposed so as to face the free end 142. The CNT 14 is the linear conductor, and the negative electrode 10 is the support conductor. The positive electrode 12 is the detection electrode.

A bias power supply 161 that is a tension control signal source for applying a DC voltage between the negative electrode 10 and the positive electrode 12 is connected to the negative electrode 10 and the positive electrode 12. A flat plate-shaped control electrode 151 is disposed parallel to the center axis of the CNT 14 (the y axis). A control power source 171 that is a signal source for outputting an AC signal used as a control voltage is connected to the control electrode 151. The control electrode 151 generates a control electric field $E_{ref}$ according to the output of the control power source 171. The control electric field $E_{ref}$ is an AC electric field in a direction (x axis direction) perpendicular to the center axis of the CNT 14. An electromagnetic wave coming from the outside is assumed to be orthogonally incident to the xy plane. That is the wave is transmitting in a direction perpendicular to the center axis of the CNT 14 and to a direction perpendicular to the center axis (from a −z axis direction, i.e., a direction perpendicular to the drawing sheet of FIG. 7). The electric field $E_{rad}$ of the electromagnetic wave is assumed to be parallel to a direction perpendicular to the center axis of the CNT 14 (to the x axis direction). In this case, the control electric field $a_{ref}$ and the electric field $E_{rad}$ of the incoming electromagnetic wave are combined together, and a composite electric field $E_d$ is formed at the position of the center axis of the CNT 14. Charges accumulated near the free end of the CNT 14 receive Coulomb forces by the composite electric field $E_d$, and the CNT 14 vibrates in a direction (x axis direction) perpendicular to the center axis where the center of the vibration is the center axis (y axis) of the CNT 14. The branching unit 19 is inserted in the line 18 connecting the negative electrode 10 to the positive electrode 12, and a vibration signal u(t) generated by the vibration of the CNT 14 is outputted from the branch terminal 20 of the branching unit 19. A band-pass filter 41 and an envelope detector 42 are connected to the branch terminal 20. An output w(t) of the envelope detector 42 is a desired phase signal R$\theta$(t). The line 18, the branching unit 19, the branch terminal 20, the band-pass filter 41, and the envelope detector 42 form an output unit.

Next, the operation of the phase detector 2 according to the present embodiment will be described. The output voltage $V_{ext}$ of the bias power supply 161 is assumed to be a variable DC voltage. The AC voltage outputted from the control power source 171 is assumed to be a single cosine wave.

1. Field Emission (Tunneling Conduction)

The same description as in embodiment 1 holds. Let the gap between the forward free end 142 of the CNT 14 and the positive electrode 12 facing the free end 142 (the gap is hereinafter referred to as a "free end distance") be h(t). The free end distance h(t) is a function of time. This is because the free end 142 of the CNT 14 vibrates in the x axis direction as described later and therefore the free end distance changes with time.

As is well known, when field emission of electrons from the free end 142 toward the positive electrode 12 occurs, the current I(t) flowing through the line 18 is represented by equation (24).

[Formula 24]

$$I(t) = c_1 A_s \, (E_g(h))^2 \, \exp\left(-\frac{c_2}{E_g(h)}\right) \quad (24)$$

Here, $A_s$ is the area of a cross section of the free end 142 of the CNT 14 which cross section is perpendicular to the center axis, and $c_1$ and $c_2$ are coefficients determined by fundamental constants and the work function of the CNT 14.

Specifically, $c_1 = 3.4 \times 10^{-5}$ A/V², and $c_2 = 7.0 \times 10^{10}$ V/m. $E_g(h)$ is the electric field in the vicinity of the surface of the free end 142 (hereinafter referred to as a "free end surface electric field") and is generated by the voltage $V_{ext}$ of the output voltage of the bias power supply 161. The free end surface electric field $E_g(h)$ is a function of the free end distance h(t).

h(t) is the distance between the free end 142 and the positive electrode 12 when the CNT 14 bends to vibrate and the free end 142 vibrates in the x axis direction with the lapse of time t. The linear approximation of h(t) is given by equation (25).

[Formula 25]

$$h(t) = h_0 + \Delta h(t) \quad (25)$$

Figure 8:
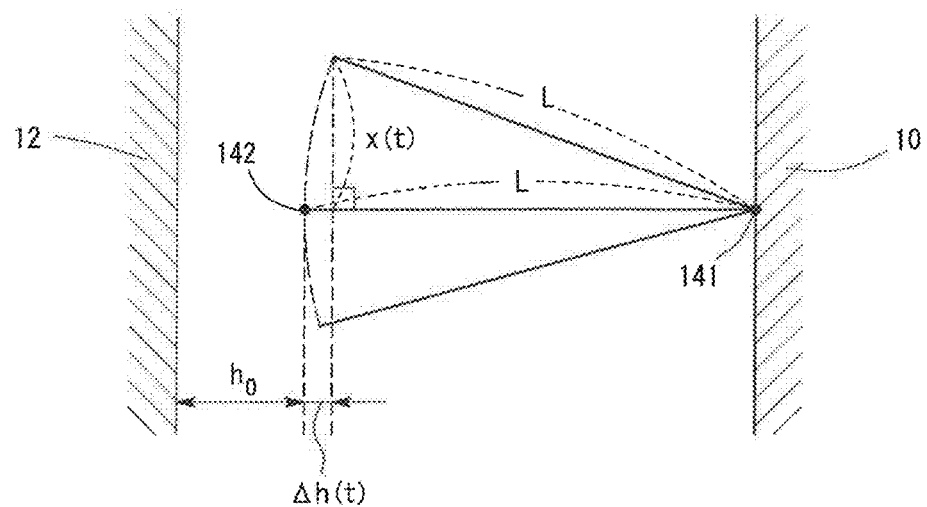
FIG. 8 Illustration showing the relation among an increase Δh in distance between a tip of a carbon nanotube and a positive electrode, the x coordinate of the tip, and the length L of the carbon nanotube in embodiment 3.

As shown in FIG. 8, $h_0$ is the distance between the free end 142 and the positive electrode 12 when the CNT 14 is not bent and is straight and parallel to the y axis, i.e., is the minimum value of the free end distance. $\Delta h(t)$ is an increase in the free end distance with respect to the free end distance $h_0$ when the free end 142 bends and vibrates in the x axis direction with the lapse of time L. Note that $\Delta h(t) > 0$.

The free end surface electric field $E_g(h)$ is a function of the free end distance h, and the linear approximation of the free end surface electric field $E_g(h)$ is given by equation (26). $E_{g0}$ is the free end surface electric field when the CNT 14 is not bent and is straight and parallel to the y axis. When the free end 142 vibrates in the x axis direction as a result of bending of the CNT 14 and the free end distance h(t) increases by $\Delta h(t)$, an increase in the free end surface electric field $\Delta E_g(h)$ with respect to $E_{g0}$ is represented by equation (27). As the free end distance h(t) increases, the free end surface electric field $E_g(h)$ decreases. Therefore, although $\Delta h(t) > 0$, $\Delta E_g(h) < 0$.

[Formula 26]

$$E_g(h) = E_{g0} + \left(\frac{\partial E_g}{\partial h}\right)_{h=h_0} \Delta h(t) \quad (26)$$

[Formula 27]

$$\Delta E_g(h) = \left(\frac{\partial E_g}{\partial h}\right)_{h=h_0} \Delta h(t) \quad (27)$$

The linear approximation of the tunneling current I(t) is defined by equation (28) using a tunneling current $I_0$ and an increase in the tunneling current $\Delta I(t)$. $I_0$ is a tunneling current when the CNT 14 is not bent and is straight and parallel to the y axis, i.e., the maximum value of the tunneling current I(t). $\Delta I(t)$ is an increase in the tunneling current when the CNT 14 is bent to cause the free end 142 to vibrate in the x axis direction and the free end distance h(t) increases by $\Delta h(t)$ Note that $\Delta I(t) < 0$.

The current $I_0$ is a current when the free end surface electric field is $E_{g0}$ and is represented by equation (29) using equation (24). The increase $\Delta I(t)$ is obtained through expansion of equation (24) to the first order with respect to the free end surface electric field $E_g$; i.e., given by equation (30).

[Formula 28]

$$I(t) = I_0 + \Delta I(t) \quad (28)$$

[Formula 29]

$$I_0 = c_1 A (E_{g0})^2 \exp\left(-\frac{c_2}{E_{g0}}\right) \quad (29)$$

[Formula 30]

$$\Delta I(t) = I_0\left(2 + \frac{c_2}{E_{g0}}\right)\left(\frac{\Delta E_g(h)}{E_{g0}}\right) \quad (30)$$

By substituting the relation between the increase $\Delta E_g(h)$ and the increase $\Delta h(t)$ represented by equation (27) into equation (30), the increase $\Delta I(t)$ in the tunneling current I(t) is represented by equation (31).

[Formula 31]

$$\Delta I(t) = I_0\left(2 + \frac{c_2}{E_{g0}}\right)\left(\frac{\partial E_g}{\partial h}\right)_{h=h_0} \frac{\Delta h(t)}{E_{g0}} \quad (31)$$

2. Vibration of CNT 14

The incoming electromagnetic wave is assumed to be a cosine wave with a single frequency. Then the electric field $E_{rad}$ in the x axis direction at the position of the center axis of the CNT 14 can be represented by equation (32).

[Formula 32]

$$E_{rad}(t) = a \cos(\omega t + \theta) \quad (32)$$

Here, a is the amplitude of the electric field $E_{rad}(t)$ of the electromagnetic wave, and θ is its phase. The phase θ is a phase with respect to the phase of the control electric field $E_{ref}(t)$ described later.

The control voltage outputted from the control power source 171 is a DC-biased AC voltage, and the frequency of the control voltage is set to be equal to the frequency of the incoming electromagnetic wave. The control electrode 151 generates the AC control electric field in the direction perpendicular to the center axis of the CNT 14 (in the x axis direction), and the AC control electric field at the position of the center axis is denoted by $E_{ref}(t)$. $E_{ref}(t)$ is represented by equation (33).

[Formula 33]

$$E_{ref}(t) = b \cos(\omega t) + C \quad (33)$$

Here, b is the amplitude of the control electric field $E_{ref}(t)$, and C is a DC component of the electric field that corresponds to the DC bias of the control voltage Since the phase of the control electric field $E_{ref}(t)$ is used as a reference, the phase is 0.

The control electric field $E_{ref}(t)$ and the electric field $E_{rad}(t)$ of the incoming electromagnetic wave are combined together, and the composite electric field $E_d(t)$ at the position of the center axis of the CNT 14 is represented by equation (34). For the sake of simplicity, it is assumed that $E_{ref}$ and $E_{rad}$ each have only an x component.

[Formula 34]

$$E_d(t) = D\cos(\omega t + \alpha) + C \tag{34}$$

Here, D is the amplitude of the composite electric field $E_d(t)$, $\alpha$ is its phase, and C is the DC component.

The amplitude C is represented by equation (35), and the phase $\alpha$ is represented by equation (36).

[Formula 35]

$$D = \sqrt{a^2 + b^2 + 2ab\cos\theta} \tag{35}$$

[Formula 36]

$$\tan\alpha = \frac{a\sin\theta}{a\cos\theta + b} \tag{36}$$

The CNT 14 is a cantilever having the fixed end 141 and the free end 142. Therefore, negative charges Q accumulated in the vicinity of the free end 142 of the CNT 14 receive Coulomb forces from the composite electric field $E_d$. The CNT 14 thereby bends in the x axis direction perpendicular to the center axis, and the free end 142 of the CNT 14 vibrates in the x axis direction in response to changes in the polarity of the composite electric field $E_d$. The equation of motion of the vibrating free end 142 in the x coordinate is given by equation (37). However, it is assumed that free end distance h(t) is sufficiently larger than the amplitude of the x coordinate.

[Formula 37]

$$m\frac{d^2x}{dt^2} + s\frac{dx}{dt} + kx = QD\cos(\omega t + \alpha) + QC \tag{37}$$

Here, m is the effective mass of the CNT 14, s is a damping coefficient, k is an elastic constant, and Q is the amount of charges accumulated in the free end 142 of the CNT 14. The elastic constant k is given by equation (38). Quadratic and higher non-linear terms are assumed to be small, so that the elastic constant can be regarded as constant. For the sake of simplifying the description, it is assumed that the x coordinate of the free end 142 of the CNT 14 is approximated by a linear equation of motion represented by equation (37).

[Formula 38]

$$k = \frac{3YP}{L^3} \tag{38}$$

Here, Y is the Young's modulus, P is the moment of inertia of the CNT 14, and L is the length of the CNT 14.

The solution of the differential equation (37), i.e., the x coordinate x(t) of the free end 142, is represented by equation (39).

[Formula 39]

$$x(t) = B\cos(\omega t - \phi) + \frac{QC}{k} \tag{39}$$

The amplitude B is represented by equation (40), the phase $\alpha + \phi$ is represented by equation (41), and the phase $\phi$ is represented by equation (42).

[Formula 40]

$$B = \frac{QD}{\sqrt{(k - m\omega^2)^2 + (s\omega)^2}} \tag{40}$$

[Formula 41]

$$\alpha + \phi = \tan^{-1}\left(\frac{s\omega}{k - m\omega^2}\right) \tag{41}$$

[Formula 42]

$$\phi = \tan^{-1}\left(\frac{s\omega - (k - m\omega^2)\tan\alpha}{(k - m\omega^2) + s\omega\tan\alpha}\right) \tag{42}$$

The vibration of the free end 142 of the CNT 14 has a resonance angular frequency (hereinafter referred to simply as a "resonance frequency") $\omega_0$ represented by equation (43) The amplitude $B_0$ in a resonant state is represented by equation (44), and the phase $\phi_0$ in the resonant state is represented by equation (45).

[Formula 43]

$$\omega_0 = \sqrt{\frac{k}{m}} \tag{43}$$

[Formula 44]

$$B_0 = \frac{QD}{s\omega_0} \tag{44}$$

[Formula 45]

$$\phi_0 = \pm\frac{\pi}{2} - \alpha \tag{45}$$

When the angular frequency (hereinafter referred to simply as the "frequency") of the composite electric field $E_d$ is equal to the resonance frequency $\omega_0$ the x coordinate $x_{reso}(t)$ of the free end 142 is represented by equation (46). In this case, the frequency of the incoming electromagnetic wave and also the frequency of the control voltage are equal to the resonance frequency.

[Formula 46]

$$x_{reso}(t) = \pm\frac{QD}{s\omega_0}\sin(\omega_0 t + \alpha) + \frac{QC}{k} \tag{46}$$

3. Phase Detection

As is clear from equation (31), the increase $\Delta I(t)$ in the tunneling current I(t) depends on the increase $\Delta h(t)$. Under the assumption that the CNT 14 is a rigid body, the vibration of the free end 142 is approximated as infinitesimal rotational vibration about the fixed end 141 in a positive-negative direction. As shown in FIG. 8, $\Delta h(t)$ is represented by equation (47) that is derived from the Pythagorean theorem using the position x(t) of the free end 142 and the length L of the CNT 14.

[Formula 47]

$$\Delta h(t) = L - \sqrt{L^2 - x^2(t)} \tag{47}$$

An approximation of equation (47) is given by equation

[Formula 48]

$$\Delta h(t) = L\left\{1 - \sqrt{1 - \left(\frac{x(t)}{L}\right)^2}\right\} = \frac{x^2(t)}{2L} \tag{48}$$

By substituting equation (48) into equation (31) representing $\Delta I(t)$, $\Delta I(t)$ is represented by equation (49). By using a constant G defined by equation (51), $\Delta I(t)$ is shown by equation (52) and is proportional to the square of the x coordinate of the free end 142. As the free end distance h(t) increase, the free end surface electric field $E_g$ decreases. Therefore, $\partial E_b/\partial h$ is defined as negative, and the constant G is defined as positive.

[Formula 49]

$$\Delta I(t) = I_0 \left(2 + \frac{c_2}{E_{g0}}\right)\left(\frac{\partial E_g}{\partial h}\right)_{h=h_0} \frac{x^2(t)}{2LE_{g0}} \tag{49}$$

[Formula 50]

$$\Delta I(t) = -I_0 G\, x^2(t) \tag{50}$$

[Formula 51]

$$G = -\left(2 + \frac{c_2}{E_{g0}}\right)\left(\frac{\partial E_g}{\partial h}\right)_{h=h_0} \frac{1}{2LE_{g0}} \tag{51}$$

By substituting x(t) represented by equation (39) into equation (50), equation (52) is obtained.

[Formula 52]

$$\Delta I(t) = \tag{52}$$
$$-\frac{1}{2}I_0 G\left\{B^2 \cos[2(\omega t - \phi)] + \frac{4BQC}{k}\cos(\omega t - \phi) + 2\left(\frac{QC}{k}\right)^2 + B^2\right\}$$

When the frequency of the composite electric field $E_d$ is equal to the resonance frequency $\omega_0$, the CNT 14 is in the resonant state. In this case, by substituting equation (46) representing the x coordinate of the free end 142 in the resonant state into equation (50), equation (53) is obtained.

[Formula 53]

$$\Delta I(t) = -\frac{1}{2}I_0 G\left\{-\left(\frac{QD}{s\omega_0}\right)^2 \cos[2(\omega_0 t + \alpha)] \pm \frac{4Q^2 DC}{ks\omega_0}\sin(\omega_0 t + \alpha) + 2\left(\frac{QC}{k}\right)^2 + \left(\frac{QD}{s\omega_0}\right)^2\right\} \tag{53}$$

As shown above, the increase $\Delta I(t)$ in the tunneling current includes components with frequencies of $\omega$ and $2\omega$ ($2\omega_0$ and $\omega_0$ in the resonant state) and DC components. As is clear from equation (35), the amplitude D of the composite electric field $E_d$ varies according to the phase $\theta$ of the incoming electromagnetic wave. The vibration signal u(t) outputted from the branch terminal 20 of the branching unit 19 is $\Delta I(t)$. When the DC component C of the control electric field $E_{ref}$ is 0, $\Delta I(t)$ includes only the second harmonic ($2\omega$, $2\omega_0$) component.

In the following description, it is assumed that the CNT 14 is in the resonant state, for the sake of simplicity. It is also assumed that the incoming electromagnetic wave is a phase modulated wave, and the phase modulated signal is demodulated by the phase detector 2 of the present embodiment. The phase $\theta$ of the electric field $E_{rad}(t)$ of the electromagnetic wave in equation (32) is the modulating signal $\theta(t)$. Since the incoming electromagnetic wave is a phase modulated wave, it can be assumed that the modulation index is sufficiently small, and the fluctuation range of $\theta(t)$ is sufficiently small. In the control electric field $E_{ref}$ represented by equation (33), when a sine function $-b\sin(\omega t)$ is used instead of $b\cos(\omega t)$, the amplitude D of the composite electric field $E_d(t)$ is represented by an equation obtained by replacing $\cos(\theta)$ in equation (35) with $\sin(\theta)$. This simply means that the phase of the control voltage is shifted by $\pi/2$ with respect to the phase of the carrier wave of the electromagnetic wave.

Therefore, a signal v(t) obtained by causing the vibration signal $\Delta I(t)$ to pass through the band-pass filter 74 to extract the second harmonic $2\omega_0$ is represented by equation (54).

[Formula 54]

$$v(t) = \frac{I_0 GQab}{2s\omega_0}\sin\theta\,\cos[2(\omega_0 t + \alpha)] \tag{54}$$

By inputting this signal v(t) to the envelope detector 42, the amplitude w(t) of v(t) can be obtained. In the case of phase modulation, $\theta(t)$ is assumed to be sufficiently small, so that w(t) is represented by equation (55). Note that R is a constant. Specifically, using the output w(t) of the envelope detector 42, the modulating signal $\theta(t)$ can be obtained.

[Formula 55]

$$w(t) = R\theta(t) \tag{55}$$

As is clear from equation (53), when only the baseband is extracted from the vibration signal $\Delta I(t)$, a signal obtained from the $(QD/s\omega_0)^2$ term is the amplitude itself of equation (54), so that the phase modulated signal $R\theta(t)$ in equation (55) is demodulated. As described above, by extracting the baseband of the vibration signal $\Delta I(t)$, the phase modulated signal $\theta(t)$ can also be demodulated.

When the DC bias voltage C is present in the control electric field $E_{ref}$, D is present in the first order term ($\omega_0$) as shown in equation (53). Therefore, by extracting the band including the frequency $\omega_0$ from the vibration signal $\Delta I(t)$, the phase modulated signal $\theta(t)$ can also be demodulated.

Figure 9:
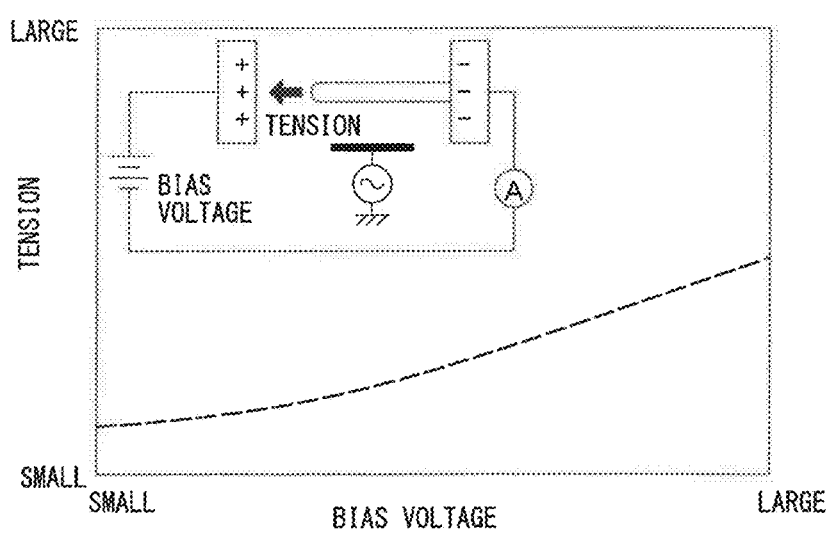
FIG. 9 Characteristic diagram showing the relation between the voltage outputted from a bias power supply of the device in the embodiment and the tension of the carbon nanotube.
Figure 10:
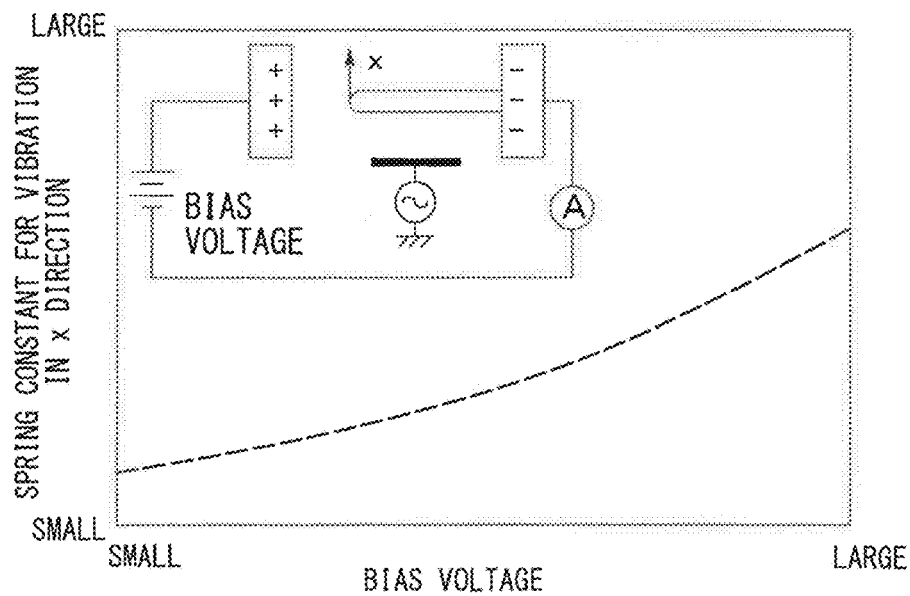
FIG. 10 Characteristic diagram showing the relation between the voltage outputted from the bias power supply or the device in the embodiment and an elastic constant of the carbon nanotube that is relevant to the vibration mode of the free end of the carbon nanotube.

The resonance frequency $\omega_0$ can be controlled as follows. As is clear from equation (43), the resonance frequency $\omega_0$ depends on the elastic constant k of the CNT 14. The elastic constant k depends on the voltage $V_{ext}$ of the bias power supply 161. As shown in FIG. 9, as the voltage $V_{ext}$ (bras voltage) increases, the attractive force acting on the free end 142 of the CNT 14 from the positive electrode 12 increases. Specifically, a tensile stress (tension) in the y-axis direction, i.e., the center axis direction, is applied to the CNT 14. As shown in FIG. 10, the larger the tensile stress in the center axis direction, the larger the elastic constant k of the free end 142 in the x axis direction perpendicular to the center axis. Specifically, the elastic constant k is $k=g(V_{ext})$ which is a function of the voltage $V_{ext}$ of the bias power supply 161.

By controlling the voltage $V_{ext}$ of the bias power supply 161, the resonance frequency $\omega_0$ of the CNT 14 can be changed to selectively match the frequency of the incoming electromagnetic wave, and the gain of the vibration signal detected can be increased. In other words, the phase detector can be tuned to the incoming electromagnetic wave.

Phase modulation and frequency modulation are equivalent. Therefore, even when the incoming electromagnetic wave is a frequency modulated signal, the modulating signal can be demodulated in the manner described above.

Figure 11:
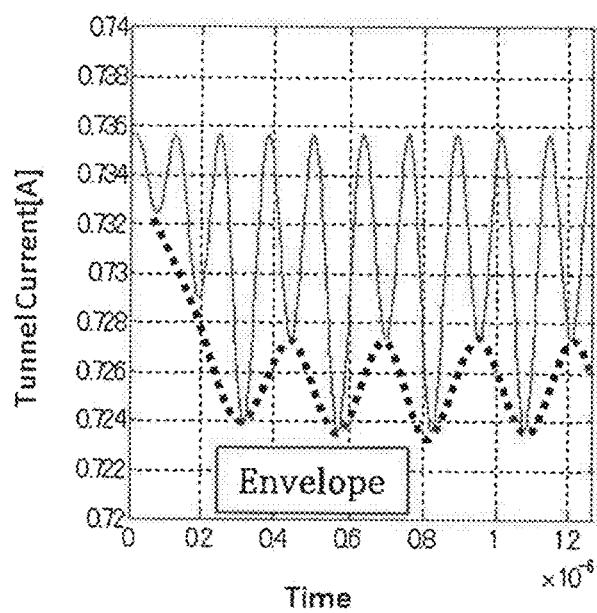
FIG. 11 Waveform diagram determined by the Euler-Bernoulli beam theory, the waveform diagram showing chat an oscillating current outputted from a detection electrode varies according to phase.
Figure 12:
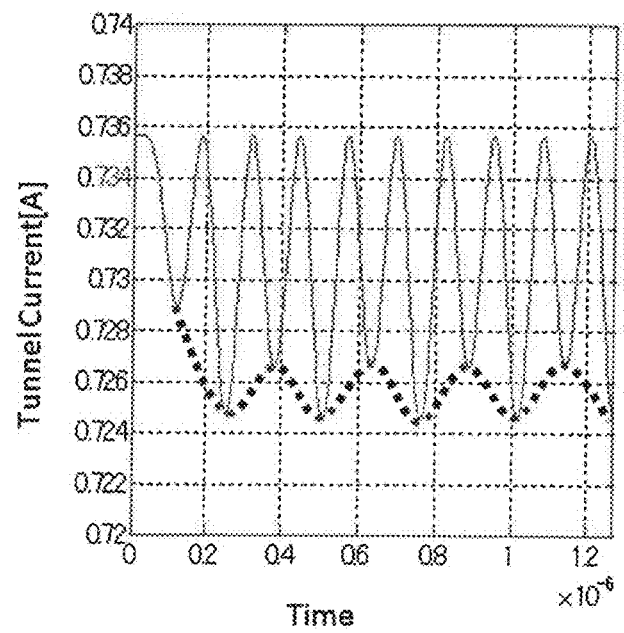
FIG. 12 Waveform diagram determined by the Euler-Bernoulli beam theory, the waveform diagram showing that the oscillating current outputted from the detection electrode varies according to phase.

In the above description, the equation of motion of the free end 142 of the CNT 14 in the x axis direction is represented by equation (37) which is linear. However, since the elastic constant k is a function of the displacement x, the equation of motion is actually a non-linear equation, and its analytic solution cannot be determined. Therefore, the non-linear equation was solved by numerical computation to determine an oscillating current $\Delta I(t)$ (corresponding to equation (53)). The results are shown in FIGS. 11 and 12. The difference between FIGS. 11 and 12 is caused by the difference in the phase $\theta$ of the electric field $E_{rad}$ of the incoming electromagnetic wave. As can be seen, the amplitude of the envelope varies according to the phase $\theta$. The chance in the amplitude of the envelope with time corresponds to $\theta(t)$ in equation (55).

Figure 13:
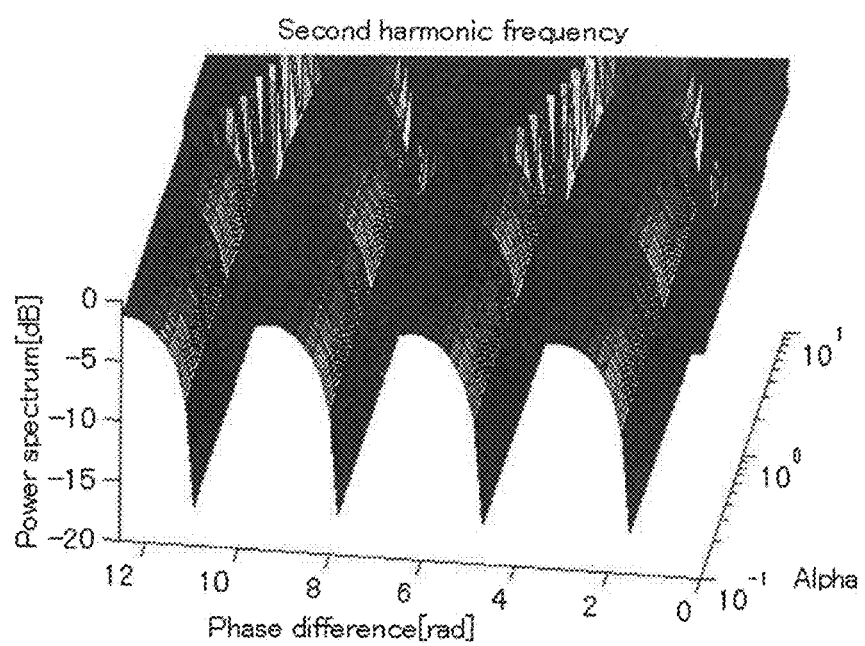
FIG. 13 Characteristic diagram determined by the Euler-Bernoulli beam theory, the characteristic diagram showing the relation between the phase of a second harmonic of the oscillating current outputted from the detection electrode and a power spectrum.

Chances in the power spectrum of the second harmonic ($2\omega_0$) of the oscillating current $\Delta I(t)$ versus the phase $\theta$ were determined by similar numerical computation. The results are shown in FIG. 13. As can be seen, the power spectrum changes with the phase $\theta$ of the incoming electromagnetic wave $E_{rad}$. This also shows that the phase information included in the electric field $E_{rad}$ of the incoming electromagnetic wave can be obtained from the oscillating current $\Delta I(t)$.

The phase of the control voltage may be feedback controlled such that the amplitude of the demodulated signal w(t) represented by equation (55) increases. The amplitude becomes maximum when the difference between the phase of the carrier wave of the incoming electromagnetic wave and the phase of the control voltage is $\pi/2$.

Two phase detectors each having the above-described structure may be disposed parallel such that they are located close to each other. In this case, a voltage of $\sin(\omega t+\beta)$ and a voltage of $\cos(\omega t+\beta)$ are applied to the respective phase detectors as control voltages, and the phase $\beta$ is changed. The phase $\beta$ is set such that the second harmonic of the oscillating current $\Delta I(t)$ when $\cos(\omega t+\beta)$ is used as the control voltage is zero. By using, as the demodulated signal, w(t) represented by equation (55) in the device in which the control voltage is a voltage of $\sin(\omega t+\beta)$, the phase signal can be demodulated with high sensitivity. In other words, this corresponds to quadrature demodulation of the electromagnetic wave.

In the present invention, the electromagnetic wave is not limited to communication waves and broadcast waves and may be any type of electromagnetic wave so long as the CNT 14 is sensitive to the frequency of the electromagnetic wave. The phase modulated signal $\theta(t)$ may be an analog signal or a digital signal such as a QPSK signal or a QAM signal. In this case, a pilot signal in which the phase difference between adjacent symbols is known is transmitted as a data transmission preamble, and the phase of the control voltage is changed during demodulation such that the detected phase difference is equal to a prescribed value. In this manner, correct phase data can be demodulated.

Embodiment 4

Figure 14:
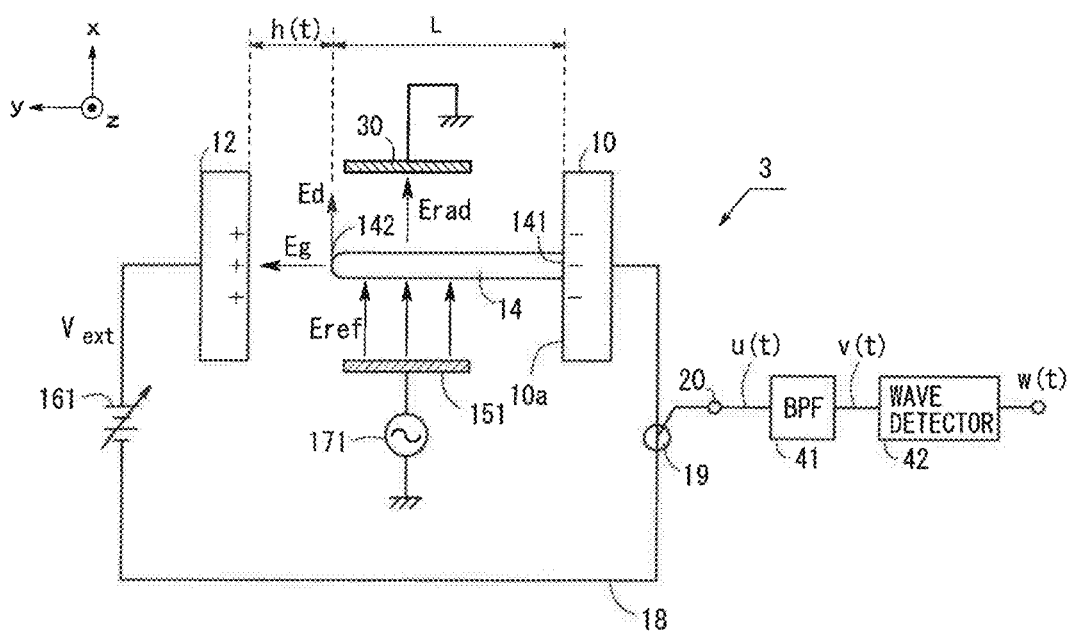
FIG. 14 Configuration diagram showing a signal processor according to specific embodiment 4 of the present invention.

FIG. 14 shows a phase detector 3 according to embodiment 4. The difference from the device in embodiment 3 is that a grounding electrode 30 is disposed at a position symmetric to the position of the control electrode 151 with respect to the CNT 14 serving as the center axis. With this configuration, the control electric field $E_{ref}$ generated by the control electrode 151 can be exactly parallel to the x axis, i.e., exactly perpendicular to the center axis of the CNT 14. This allows the composite electric field composed of the control electric field $E_{ref}$ and the electric field $E_{rad}$ of the incoming electromagnetic wave to be increased and also allows the free end 142 of the CNT 14 to efficiently vibrate in the x axis direction. The other components are the same as those in embodiment 3

Embodiment 5

Next, a phase detector 4 according to embodiment 5 will be described.

Figure 15:
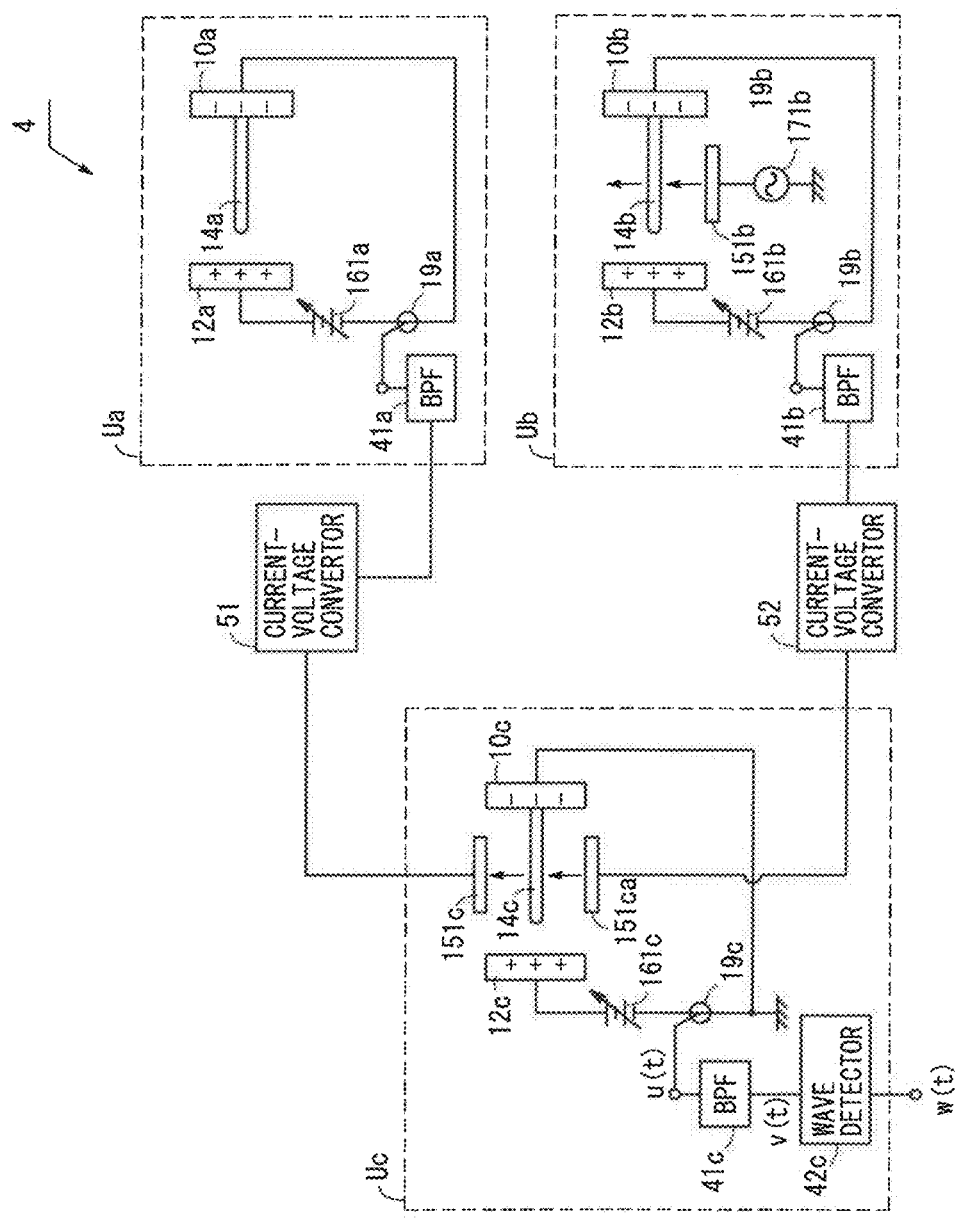
FIG. 15 Configuration diagram showing a signal processor according to specific embodiment 5 of the present invention.

In FIG. 15, an electromagnetic wave detection unit Ua, a reference signal output unit Ub, and a phase detection unit Uc each have the same configuration as that of the phase detector 2 shown in FIG. 7. As for the bias power supply 161, the CNT 14, the negative electrode 10, the positive electrode 12, the control electrode 151, the control power source 171, and the band-pass filter 41, their corresponding members are denoted by the same numerals with identification symbols a, b, and c for the respective units attached. The electromagnetic wave detection unit Ua and the reference signal output unit Ub include no envelope detector 42. The phase detection unit Uc includes a control electrode 151c and an additional control electrode 151ca disposed opposite the control electrode 151c with respect to a CNT 14c. The control electrode 151c, the CNT 14c, and the additional control electrode 151ca are parallel to each other. The phase detection unit Uc further includes a band-pass filter 41c and an envelope detector 42c.

The electromagnetic wave detection unit Ua includes no control electrode, and no control electric field $E_{ref}$ is applied to the CNT 14a. In this case, in equations (33) and (34), b=0, C=0, and D=a, so that $\alpha=\theta$ from equation (36). Therefore, an equation representing an oscillating current $\Delta Ia(t)$ outputted from the electromagnetic wave detection unit Ua is obtained by replacing D with a and $\alpha$ with $\theta$ in equation (53). Therefore, the oscillating current $\Delta Ia(t)$ outputted from the electromagnetic wave detection unit Ua is a signal depending only on the incoming electromagnetic wave.

The reference signal output unit Ub has a shielding structure that can block the incoming electromagnetic wave, and the CNT 14b is not sensitive to the incoming electromagnetic wave but is sensitive only to the control electric field $E_{ref}$ and vibrates in the response to the control electric field $E_{ref}$. In this case, in equations (32) and (34), a=0, $\theta=0$, $\alpha=0$, and D=b. Therefore, an equation representing the oscillating current $\Delta Ib(t)$ outputted from the reference signal output unit Ub is obtained by replacing $\alpha$ with 0 and D with b in equation (53). Therefore, the oscillating current $\Delta Ib(t)$ outputted from the reference signal output unit Ub is a signal depending only on the control electric field $E_{ref}$.

The band-pass filters 41a and 41b are filters that allow the second harmonic ($2\omega_0$) band to pass. The second harmonic $v_a(t)$ of the vibration signal $\Delta Ia(t)$ outbutted from the electromagnetic wave detection unit Ua is represented by equation (56).

[Formula 56]

$$v_a(t) = \frac{I_0 GQa}{2s\omega_0} \cos[2(\omega_0 t + \theta)] \quad (56)$$

The second harmonic $v_a(t)$ is converted to a voltage by a current-voltage converter 51, and the voltage is applied to the control electrode 151c of the phase detection unit Uc. The second harmonic $V_b(t)$ of the vibration signal $\Delta Ib(t)$ outputted from the reference signal output unit Ub is represented by equation (57). The second harmonic $v_b(t)$ is converted to a voltage by a current-voltage converter 52, and the voltage is applied to the control electrode 151ca of the phase detection unit Uc.

[Formula 57]

$$v_b(t) = \frac{I_0 GQb}{2s\omega_0} \cos[2(\omega_0 t)] \quad (57)$$

The electric field $E_{rad}$ generated by the control electrode 151c is represented by a function proportional to equation (56) instead of equation (32), and the electric field $E_{ref}$ generated by the additional control electrode 151ca is represented by a function proportional to equation (57) instead of equation (33). Therefore, a and b in the amplitude D of the composite electric field $E_d$ at the center axis of the CNT 14c are represented by equations obtained by replacing them with the coefficients of the second harmonics in equations (56) and (57). The composite electric field $E_d$ is represented by an equation obtained by replacing C with 0 and $\omega$ with $2\omega_0$ in equation (34). Therefore, the vibration signal $\Delta Ic(t)$ in the phase detection unit Uc is represented by an equation obtained by replacing D in equation (53) with D' newly defined by equation (35) and replacing $\omega_0$ with $2\omega_0$. When the band-pass filter 41c is a filer that allows the band of the forth harmonic ($4\omega_0$) to pass, the extracted signal $V_c(t)$ is represented by equation (58). As in the case of embodiment 3, the difference between the phase of the control voltage applied to the control electrode 171b of the reference signal output unit Ub and the phase of the carrier wave of the incoming electromagnetic wave is $\pi/2$. A method for achieving this relation has been described in embodiment 3. Therefore, the output of the envelope detector 42c is the un modulated signal $R\theta(t)$ of the baseband represented by equation (55).

[Formula 58]

$$v_c(t) = A \sin\theta \cos[4(\omega_0 t + \alpha)] \quad (58)$$

Embodiment 6

Figure 16:
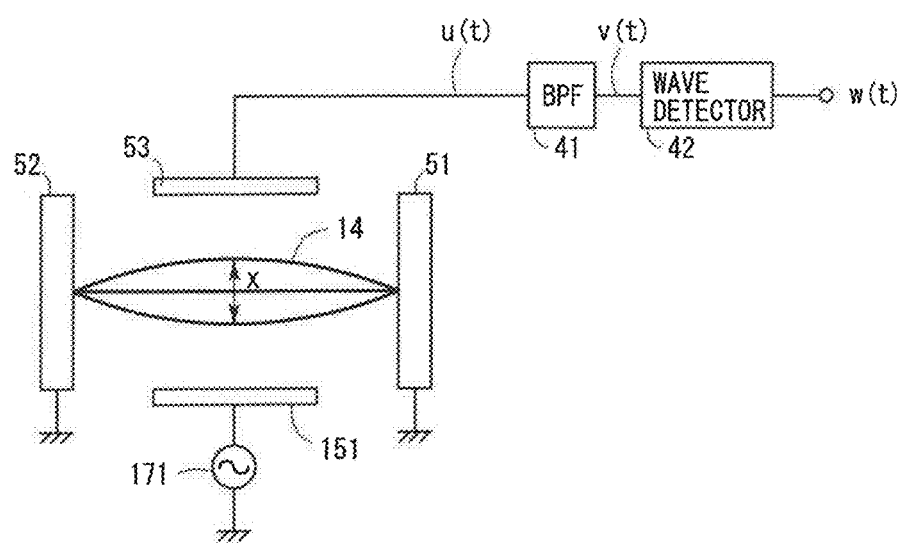
FIG. 16 Configuration diagram showing a signal processor according to specific embodiment 6 of the present invention.

As shown in FIG. 16, in embodiment 6, the CNT 14 is a both end supported beam. In FIG. 16, ends of the CNT 14 are fixed to a first support conductor 51 and a second support conductor 52, respectively. The first support conductor 51 and the second support conductor 52 are grounded. The control electrode 151 and the control power source 171 are configured as in embodiment 3. Therefore, as in embodiment 3 the CNT 14 vibrates in the x axis direction perpendicular to the length of the TNT 14 in response to the composite electric field $E_d$ composed of the electric field $E_{rad}$ of the incoming electromagnetic wave and the control electric field $E_{ref}$ generated by the control electrode 151. This vibration is detected as a change in capacity by a detection electrode 53 disposed parallel to the CNT 14. The capacity does not linearly vary with respect to the x coordinate of the free end of the CMT 14c. Therefore, harmonic components are present. As in the above-described case, the oscillating current detected by the detection electrode 53 is represented by an equation similar to equation (53).

The detection electrode 53 may be omitted. In this case, the second harmonic component may be separated from a current flowing through the control electrode 151. By using a band-pass filter that allows the band of the second harmonic to pass, the second harmonic component of the oscillating current generated as a result of the vibration of the TNT can be separated from the component having the frequency $\omega$ of the control voltage, and the phase modulated signal $\theta(t)$ can thereby be demodulated.

INDUSTRIAL APPLICABILITY

The present invention can be used for a compact high-sensitivity signal controller that controls phase and/or amplitude or detects the phase.

DESCRIPTION OF REFERENCE NUMERALS

1 phase shifter
2, 3, 4 phase detector
10 negative electrode
12 positive electrode
14 CNT
14a, 141 fixed end
14b, 142 free end
15 driving electrode
151 control electrode
16 first signal source
161 bias power supply
17 second signal source
171 control power source

The invention claimed is:

1. A signal processor for processing an AC signal, comprising:
   a support conductor;
   a linear conductor having a first end fixed to the support conductor, the linear conductor vibrating in response to an AC electric field so as to have a displacement component perpendicular to a lengthwise direction of the linear conductor;
   a control electrode that applies the AC electric field to the linear conductor, the AC electric field having a component perpendicular to the lengthwise direction of the linear conductor;
   a detection electrode that detects a vibration signal generated as a result of the vibration of the linear conductor;
   a signal source that applies an AC signal to the control electrode; and
   an output unit that uses, as a processed signal obtained from the AC signal, information about the amplitude of the vibration signal detected by the detection electrode or the phase of the vibration signal,
   wherein the support conductor comprises a negative electrode and a positive electrode,
   wherein the first end of the linear conductor is fixed to the negative electrode, the linear conductor having a second end serving as a free end, the second end being disposed so as to face the positive electrode with a small gap between the second end and the positive electrode, wherein the signal processor further comprises a tension control signal source that applies a variable voltage between the negative electrode and the positive electrode, the variable voltage being used to control a tension applied to the linear conductor, and wherein the output unit outputs a signal that is obtained by controlling the amplitude or phase of the AC signal outputted from the signal source according to the variable voltage outputted from the tension control signal source.

2. A signal processor according to claim 1, wherein the AC signal outputted from the signal source has a frequency that is set to be equal to the natural frequency of the vibration of the free end of the linear conductor.

3. A signal processor according to claim 1, wherein the signal processor is a phase shifter, and wherein the output unit outputs a signal that is obtained by shifting the phase of the AC signal outputted from the signal source by a phase shift amount determined by a DC voltage outputted from the tension control signal source.

4. A signal processor according to claim 1, wherein the signal processor is a phase modulator, and wherein the variable voltage outputted from the tension control signal source is a biased AC signal, and the output unit outputs a signal that is obtained by modulating the phase of the AC signal outputted from the signal source according to the biased AC signal.

5. A signal processor according to claim 1, wherein the signal processor is an amplitude modulator, wherein a signal outputted from the tension control signal source is a biased AC signal, and the output unit outputs a signal that is obtained by modulating the amplitude of the AC signal outputted from the signal source according to the biased AC signal.

6. A signal processor according to claim 1, wherein the linear conductor is a carbon nanotube, a metal wire, or conductive silicon.

7. A signal processor for processing an AC signal, comprising:
   a support conductor;
   a linear conductor having a first end fixed to the support conductor, the linear conductor vibrating in response to an AC electric field so as to have a displacement component perpendicular to a lengthwise direction of the linear conductor;
   a control electrode that applies the AC electric field to the linear conductor, the AC electric field having a component perpendicular to the lengthwise direction of the linear conductor;
   a detection electrode that detects a vibration signal generated as a result of the vibration of the linear conductor;
   a signal source that applies an AC signal to the control electrode; and
   an output unit that uses, as a processed signal obtained from the AC signal, information about the amplitude of the vibration signal detected by the detection electrode or the phase of the vibration signal,
   wherein the signal processor is a phase detector that detects the phase of an incoming electromagnetic wave,
   wherein the linear conductor is a conductor that vibrates in response to an electric field of the electromagnetic wave so as to have a displacement component perpendicular to the lengthwise direction of the linear conductor,
   wherein the output unit includes a phase detector that detects the phase of the electromagnetic wave from the amplitude of the vibration signal detected by the detection electrode,
   wherein the support conductor comprises a negative electrode and a positive electrode,
   wherein the first end of the linear conductor is fixed to the negative electrode, the linear conductor having a second end serving as a free end, the second end being disposed so as to face the positive electrode with a small gap between the second end and the positive electrode, and
   wherein the signal processor further comprises a tension control signal source that applies a variable voltage between the negative electrode and the positive electrode, the variable voltage being used to control a tension applied to the linear conductor.

8. A signal processor according to claim 7, wherein the tension control signal source is a variable voltage DC power source.

9. A signal processor according to claim 8, wherein the variable voltage outputted from the tension control signal source is controlled such that the resonance frequency of the linear conductor is equal to the frequency of the electromagnetic wave.

10. A signal processor according to claim 7, wherein the AC signal outputted from the signal source is an AC voltage biased by an arbitrary DC voltage.

11. A signal processor according to claim 10, wherein the DC voltage is controlled such that the resonance frequency of the linear conductor is equal to the frequency of the electromagnetic wave.

12. A signal processor according to claim 7, wherein the frequency of the AC signal outputted from the signal source is set to be equal to the resonance frequency of the linear conductor.

13. A signal processor according to claim 7, wherein the phase detector detects the phase of the electromagnetic wave from the amplitude of a second harmonic of the vibration signal.

14. A phase detector comprising:
   an electromagnetic wave detection unit which includes at least the support conductor, the linear conductor, and the detection electrode recited in claim 7 and which receives the electromagnetic wave by the linear conductor and outputs, from the detection electrode, a vibration signal based on the electromagnetic wave as an electromagnetic wave detection signal which is a voltage signal;
   a reference signal output unit which includes at least the support conductor, the linear conductor, the control electrode, the detection electrode, and the signal source recited in claim 7, in which the frequency of the AC signal from the signal source is set to be equal to the frequency of the electromagnetic wave, which is shielded so as to block the electromagnetic wave, and which outputs, from the detection electrode, a vibration signal based on the AC signal as a voltage reference signal; and
   a phase detection unit including at least the support conductor, the linear conductor, the control electrode, the detection electrode, and the phase detector recited in claim 7 and which further includes an additional control electrode disposed at a position opposite a position of the control electrode of the phase detection unit with respect to the linear conductor of the phase detection unit so as to be parallel to the control electrode of the phase detection unit, wherein the electromagnetic wave detection signal outputted from the electromagnetic wave detection unit is applied to the control electrode of the phase detection unit, and the reference signal outputted from the reference signal output unit is applied to the additional control electrode.

15. A signal processor according to claim 7, wherein the linear conductor is a carbon nanotube, a metal wire, or conductive silicon.

16. A signal processor for processing an AC signal, comprising:
a support conductor;
a linear conductor having a first end fixed to the support conductor, the linear conductor vibrating in response to an AC electric field so as to have a displacement component perpendicular to a lengthwise direction of the linear conductor;
a control electrode that applies the AC electric field to the linear conductor, the AC electric field having a component perpendicular to the lengthwise direction of the linear conductor;
a detection electrode that detects a vibration signal generated as a result of the vibration of the linear conductor;
a signal source that applies an AC signal to the control electrode; and
an output unit that uses, as a processed signal obtained from the AC signal, information about the amplitude of the vibration signal detected by the detection electrode or the phase of the vibration signal,
wherein the signal processor is a phase detector that detects the phase of an incoming electromagnetic wave,
wherein the linear conductor is a conductor that vibrates in response to an electric field of the electromagnetic wave so as to have a displacement component perpendicular to the lengthwise direction of the linear conductor,
wherein the output unit includes a phase detector that detects the phase of the electromagnetic wave from the amplitude of the vibration signal detected by the detection electrode, and
wherein the support conductor comprises a first support conductor and a second support conductor, the first end of the linear conductor being fixed to the first support conductor, the linear conductor having a second end fixed to the second support conductor.

17. A signal processor according to claim 16, wherein the detection electrode detects the capacitance between the detection electrode and the linear conductor to thereby detect the vibration signal.

18. A signal processor according to claim 17, wherein the control electrode serves also as the detection electrode.

19. A phase detector comprising:
an electromagnetic wave detection unit which includes at least the support conductor, the linear conductor, and the detection electrode recited in claim 16 and which receives the electromagnetic wave by the linear conductor and outputs, from the detection electrode, a vibration signal based on the electromagnetic wave as an electromagnetic wave detection signal which is a voltage signal;
a reference signal output unit which includes at least the support conductor, the linear conductor, the control electrode, the detection electrode, and the signal source recited in claim 16, in which the frequency of the AC signal from the signal source is set to be equal to the frequency of the electromagnetic wave, which is shielded so as to block the electromagnetic wave, and which outputs, from the detection electrode, a vibration signal based on the AC signal as a voltage reference signal; and
a phase detection unit including at least the support conductor, the linear conductor, the control electrode, the detection electrode, and the phase detector recited in claim 16 and which further includes an additional control electrode disposed at a position opposite a position of the control electrode of the phase detection unit with respect to the linear conductor of the phase detection unit so as to be parallel to the control electrode of the phase detection unit,
wherein the electromagnetic wave detection signal outputted from the electromagnetic wave detection unit is applied to the control electrode of the phase detection unit, and the reference signal outputted from the reference signal output unit is applied to the additional control electrode.

20. A signal processor for processing an AC signal, comprising:
a support conductor;
a linear conductor having a first end fixed to the support conductor, the linear conductor vibrating in response to an AC electric field so as to have a displacement component perpendicular to a lengthwise direction of the linear conductor;
a control electrode that applies the AC electric field to the linear conductor, the AC electric field having a component perpendicular to the lengthwise direction of the linear conductor;
a detection electrode that detects a vibration signal generated as a result of the vibration of the linear conductor;
a signal source that applies an AC signal to the control electrode;
an output unit that uses, as a processed signal obtained from the AC signal, information about the amplitude of the vibration signal detected by the detection electrode or the phase of the vibration signal; and
a grounding electrode disposed at a position opposite a position of the control electrode with respect to the linear conductor.

* * * * *